US009601717B2

(12) United States Patent
Lee et al.

(10) Patent No.: US 9,601,717 B2
(45) Date of Patent: Mar. 21, 2017

(54) ORGANIC LIGHT EMITTING DISPLAY APPARATUS

(71) Applicant: LG DISPLAY CO., LTD., Seoul (KR)

(72) Inventors: Myoungsoo Lee, Goyang-si (KR); Wonyeol Choi, Goyang-si (KR); Byoungchul Kim, Gunsan-si (KR); Heesung Park, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/749,431

(22) Filed: Jun. 24, 2015

(65) Prior Publication Data

US 2015/0380685 A1    Dec. 31, 2015

(30) Foreign Application Priority Data

| Jun. 25, 2014 | (KR) | 10-2014-0078252 |
| Jun. 25, 2014 | (KR) | 10-2014-0078438 |
| Jun. 26, 2014 | (KR) | 10-2014-0078748 |
| Jun. 22, 2015 | (KR) | 10-2015-0088088 |

(51) Int. Cl.
   *H01L 29/08*  (2006.01)
   *H01L 51/52*  (2006.01)
   *H01L 27/32*  (2006.01)

(52) U.S. Cl.
   CPC ...... *H01L 51/5256* (2013.01); *H01L 27/3246* (2013.01); *H01L 51/5237* (2013.01); *H01L 51/5243* (2013.01); *H01L 51/5246* (2013.01); *H01L 2251/301* (2013.01); *H01L 2251/5338* (2013.01)

(58) Field of Classification Search
   CPC ............ H01L 51/5256; H01L 27/3246; H01L 51/5237; H01L 51/5243; H01L 51/5246; H01L 2251/301; H01L 2251/5338
   USPC .......................................................... 257/40
   See application file for complete search history.

(56) References Cited

U.S. PATENT DOCUMENTS

| 7,326,630 B2 * | 2/2008 | Tanaka ............... B23K 26/0604 219/121.73 |
| 8,211,505 B2 * | 7/2012 | Bocko .................... B32B 17/06 427/420 |
| 8,432,097 B2 * | 4/2013 | Hirakata ............. H01L 27/3211 313/504 |
| 2005/0155704 A1 | 7/2005 | Yokajty et al. |
| 2010/0258346 A1 | 10/2010 | Chen et al. |
| 2012/0091477 A1 | 4/2012 | Kim |
| 2014/0117336 A1 | 5/2014 | Kim et al. |
| 2014/0132148 A1 | 5/2014 | Jang et al. |

(Continued)

OTHER PUBLICATIONS

U.S. Appl. No. 14/449,228, filed Aug. 1, 2014.

*Primary Examiner* — Xinning Niu
*Assistant Examiner* — Vu A Vu
(74) *Attorney, Agent, or Firm* — Birch, Stewart, Kolasch & Birch, LLP

(57) ABSTRACT

An organic light-emitting display (OLED) device includes: a pixel area defined by a plurality of pixels on a flexible substrate; a non-pixel area around the pixel area; a gate driver in the non-pixel area; a structure in the non-pixel area configured to surround the pixel area; a first encapsulation layer covering the plurality of pixels, the gate driver and the structure; and a particle cover layer covering the pixel area and suppressed from being excessively spread by the structure.

22 Claims, 15 Drawing Sheets

(56) References Cited

U.S. PATENT DOCUMENTS

2014/0319476 A1* 10/2014 Lee .................. H01L 27/32
 257/40
2015/0034916 A1* 2/2015 Lee .................. H01L 51/5253
 257/40

* cited by examiner

ORGANIC LIGHT EMITTING DISPLAY APPARATUS

CROSS-REFERENCE TO RELATED APPLICATIONS

This application claims the priority of Korean Patent Application No. 10-2014-0078438 filed on Jun. 25, 2014, Korean Patent Application No. 10-2014-0078252 filed on Jun. 25, 2014, Korean Patent Application No. 10-2014-0078748 filed on Jun. 26, 2014 and Korean Patent Application No. 10-2015-0088088 filed on Jun. 22, 2015 in the Korean Intellectual Property Office, which are all incorporated herein by reference.

BACKGROUND OF THE INVENTION

Field of the Invention

The embodiments of the present disclosure relate to an organic light-emitting display (OLED) device, and more particularly to an OLED device capable of suppressing a particle cover layer from being excessively spread.

Description of the Related Art

As the era of information technology has unfolded, the field of display devices has been growing rapidly, as information can be represented in electrical signals in the form of visual images. In accordance with this, research is ongoing for various flat panel display devices to make them thinner, lighter and capable of consuming less power. Flat panel display devices include a liquid crystal display (LCD) device, a plasma display panel (PDP) device, a field emission display (FED) device, an electro-wetting display (EWD) device, and an organic light emitting display (OLED) device, etc.

Among others, an OLED device is capable of producing light on its own, and thus, does not require an additional light source, unlike an LCD. Therefore, an OLED device can be made lighter and thinner. Further, an OLED device has advantages in that it is driven with low voltage to consume less power, and it has fast response time, wide viewing angle and infinite contrast ratio (CR). For these reasons, an OLED device is acknowledged as the next generation display device. However, an OLED device is especially vulnerable to moisture and oxygen permeation, making it is less reliable than other flat panel display devices.

An OLED device displays images using an organic light-emitting element which is self-luminous. An OLED device includes a plurality of pixels, each of which includes an organic light-emitting element. An organic light-emitting element includes a first electrode and second electrode facing each other. The organic light-emitting element further includes a light-emitting layer disposed between the first electrode and the second electrode, and is made of an organic substance and creates electroluminescence.

For a top emission OLED device, a first electrode is transparent or transflective (semi-transparent) while a second electrode is reflective, so that light generated from an organic light-emitting layer is emitted upwardly through the first electrode. Additionally, in order to ensure the reliability of an OLED device, a transparent, encapsulation unit is formed on the organic light-emitting element to protect the organic light-emitting element from oxygen and moisture. Previously in a top emission OLED device, a glass encapsulation unit was employed as the encapsulation unit.

SUMMARY OF THE INVENTION

Recently, as a replacement for inflexible flat panel display devices, a flexible organic light emitting display (FOLED) is under development. A FOLED employs a flexible substrate made of a flexible material such as plastic and can be bent like paper while still exhibiting its display functionality.

In view of the above, the inventors of the embodiments of the present disclosure have been studying to commercialize FOLED devices. Meanwhile, the inventors of the embodiments of the present disclosure have concluded that a glass substrate is not appropriate for an encapsulation unit since it is not flexible. Accordingly, the inventors of the application have studied on a novel, transparent and flexible encapsulation layer, which can be mass-produced and commercially available.

Specifically, there has been an attempt to implement an encapsulation unit of an FOLED device by using a single, flexible encapsulation layer made of an inorganic substance. However, such a flexible encapsulation layer has poor flowability and is too thin to fully cover the foreign matter, and thus, cracks are easily made by the foreign matter such as dust or particles. Therefore, moisture permeates through the cracks and causes defects in the FOLED. As defects occur, production yield becomes lower, leading to a serious problem for implementing mass production.

Under the circumstances, the inventors have devised a flexible encapsulation unit capable of improving the foreign matter-related issues, in such a manner that a particle cover layer made of an organic substance having good flowability is disposed on a flexible encapsulation layer in order to cover the foreign matter by making the top surface of the particle cover layer even, and then another single flexible encapsulation layer made of an inorganic substance is disposed on the even surface of the particle cover layer.

With high flowability, the particle cover layer effectively covers the foreign matter. However, it is difficult to control the region where the particle cover layer is applied to. That is, the organic substance of the particle cover layer easily flows in an unwanted direction. In addition, in order to make a narrow bezel, the area of the non-pixel becomes smaller. It makes the control over the particle cover layer more difficult. As a result, the particle cover layer is spread beyond the originally designed region. Hereinafter, this is referred to as an "excessive spread." In case a particle cover layer is excessively spread, it can be perceived as a spot, spoiling the appearance of an FOLED. In addition, as the particle cover layer cannot effectively protect moisture permeation, moisture may permeate through the excessively spread area.

In conclusion, for a FOLED device including a flexible encapsulation unit in which a first encapsulation layer is disposed, a particle cover layer is applied onto a part of the first encapsulation layer, and a second encapsulation layer is disposed on the particle cover layer and the first encapsulation layer, yet an excessive spread of the particle cover layer is one of the biggest issues that have to be overcome.

The inventors of the embodiments of the present disclosure have reached the idea that the excessive spread can be effectively suppressed by forming a structure in the non-pixel area, which may suppress the particle cover layer from being excessively spread. The inventors have also found that an evenness of the particle cover layer can be improved as the excessive spread is suppressed.

In view of the above, an object of the present disclosure is to provide an OLED device capable of suppressing an organic substance of a particle cover layer from being excessively spread, by forming a structure in a non-pixel area with a variety of configurations and materials.

Another object of the present disclosure is to provide an OLED device in which a multilayer structure for suppressing an organic substance from being excessively spread is formed in a non-pixel area, where a top layer of the multilayer structure includes a plurality of subsidiary structures, and the organic substance is dispersed via a storage space defined inside the subsidiary structures.

Yet another object of the present disclosure is to provide an OLED device in which a plurality of stair-like dams for suppressing an organic substance from being excessively spread is formed in a non-pixel area, and the organic substance can be dispersed by the stair-like dams.

Yet another object of the present disclosure is to provide an OLED device in which a metal structure for suppressing an organic substance from being excessively spread is formed in a non-pixel area, where the metal structure includes a plurality of subsidiary metal structures, and the organic substance can be dispersed via a storage space defined between the plurality of subsidiary metal structures.

It should be noted that objects of the present disclosure are not limited to the above-described object, and other objects of the present disclosure will be apparent to those skilled in the art from the following descriptions.

According to an aspect of the present disclosure, an organic light-emitting display (OLED) device may include a pixel area defined by a plurality of pixels on a flexible substrate; a non-pixel area around the pixel area; a gate driver in the non-pixel area; a structure in the non-pixel area configured to surround the pixel area; a first encapsulation layer covering the plurality of pixels, the gate driver and the structure; and a particle cover layer covering the pixel area and suppressed from being excessively spread by the structure.

The OLED device may further include a second encapsulation layer covering the first encapsulation layer and the particle cover layer.

The structure may include at least one of an organic material and an inorganic material, and the first encapsulation layer covering the structure may resist penetration of moisture through the structure.

The structure may be a multilayer structure to suppress excessive spread of the particle cover layer, and a top layer of the multilayer structure may include a plurality of subsidiary structures, and the subsidiary structures may be spaced apart from each other and include a storage space to disperse the particle cover layer when the particle cover layer overflows.

The multilayer structure may be made of the same material as materials of at least two of a bank, a spacer, a planarizing layer and an interlayer film disposed in the plurality of pixels.

The storage space may be configured to surround the pixel area.

The particle cover layer may be configured to planarize the pixel area, and a height of the particle cover layer near the structure may be higher than a height of the structure.

The structure may include a plurality of walls, and a wall disposed closer to the inside among the plurality of walls may be lower than a wall disposed closer to the outside among the plurality of walls.

The wall disposed closer to the inside may be a single layer and may be made of the same material as a material of at least one of the bank, the spacer, the planarizing layer and the interlayer insulating film disposed in the plurality of pixels, and the wall disposed closer to the outside may be a multilayer and may be made of the same materials as materials of at least two of the bank, the spacer, the planarizing layer and the interlayer insulating film disposed in the plurality of pixels.

The structure may include a plurality of dams, wherein a height of an outer dam may be higher than a height of an inner dam among the plurality of dams from the outside of the pixel area.

The OLED device may further include a second encapsulation layer; and a flexible encapsulation unit to seal the plurality of pixels and may include the first encapsulation layer, the particle cover layer and the second encapsulation layer, and the particle cover layer may act as a compensation layer that planarizes the plurality of pixels and a height of the particle cover layer gradually decreases from the outer periphery of the plurality of pixels to the structure, and the particle cover layer may be sealed by the first encapsulation layer and the second encapsulation layer at the outer periphery of the plurality of pixels, and an area where the first encapsulation layer and the second encapsulation layer come in contact with each other may be extended beyond the structure by a particular distance.

The structure may be a stair-like dam that may become higher towards the extended area.

The stair-like dam may include a plurality of subsidiary stair-like dams spaced apart from each other, and may include an interposed storage space to disperse the particle cover layer when the particle cover layer overflows.

The structure may be a metal structure made of a metal material.

The metal structure may further include a plurality of subsidiary metal structures spaced apart from each other.

The metal structure may be made of one of silver (Ag), tin (Sn), aluminum (Al) and an indium tin oxide (ITO).

The OLED device may further include a second encapsulation layer; a flexible encapsulation unit disposed to cover the pixel area and the non-pixel area, the flexible encapsulation unit may have the first encapsulation layer, the second encapsulation layer, the structure and the particle cover layer; and a barrier film may have a pressure-sensitive adhesive layer and be attached on the flexible encapsulation unit by the pressure-sensitive adhesive layer.

The barrier film may be attached on the second encapsulation layer of the flexible encapsulation unit.

The structure may have a particular height and may surround the particle cover layer in the non-pixel area, so that a portion of the pressure-sensitive adhesive layer may be pressed by the structure to be attached in the non-pixel area.

The structure may be a multilayer structure made of the same materials as materials of at least two of a bank, a spacer, a planarizing layer and an interlayer film disposed in the plurality of pixels.

The multilayer structure may have a particular height that is capable of suppressing the excessively spread for increasing adhesion of the barrier film.

A width in cross section of a top layer of the multilayer structure may be narrower than a width in cross section of a bottom layer thereof.

Particulars of various example embodiments of the present disclosure are included in the detailed description and the accompanying drawings.

According to the embodiments of the present disclosure, a structure for effectively suppressing a particle cover layer from being excessively spread is formed in a non-pixel area with a variety of configurations and materials without requiring any additional process, so that the unwanted excessive spread problem of the particle cover layer in a flexible encapsulation unit can be improved.

In addition, according to the embodiments of the present disclosure, an evenness of a particle cover layer formed in a pixel area can be improved.

Further, according to the embodiments of the present disclosure, an organic substance can be disposed via a storage space by a structure including subsidiary structures, or a metal structure including a plurality of subsidiary metal structure or a plurality of subsidiary stair-like dams. As a result, defects in an OLED device can be reduced, and spots can be less perceived.

It should be noted that effects of the embodiments of the present disclosure are not limited to those described above and other effects of the embodiments of the present disclosure will be apparent to those skilled in the art from the following descriptions.

BRIEF DESCRIPTION OF THE DRAWINGS

The above and other aspects, features and other advantages of the embodiments of the present disclosure will be more clearly understood from the following detailed description taken in conjunction with the accompanying drawings, in which.

DETAILED DESCRIPTION OF THE EMBODIMENTS

Figure 1:
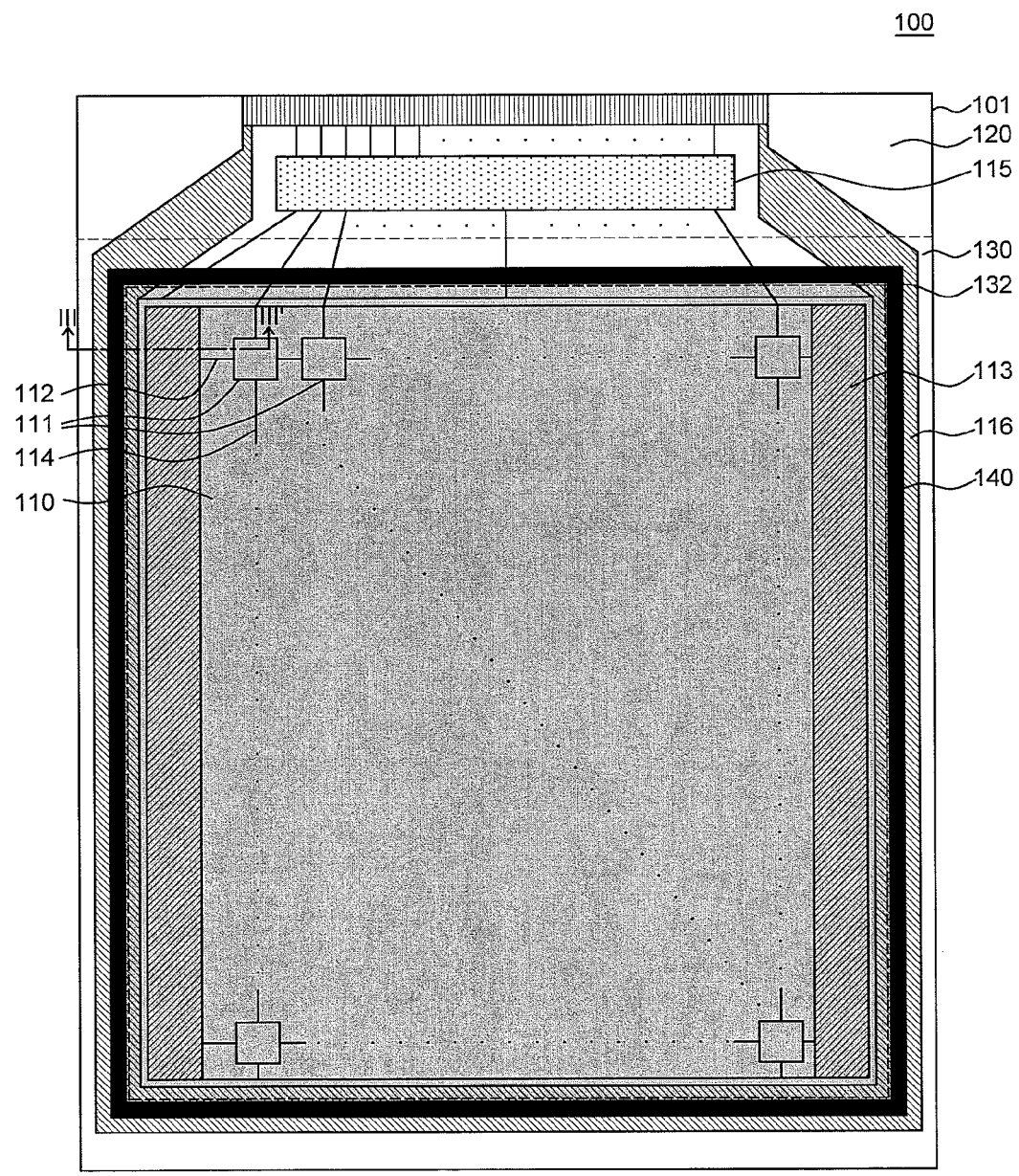
FIG. 1 is a schematic plan view of an OLED device according to an example embodiment of the present disclosure.

Advantages and features of the embodiments of the present disclosure and methods to achieve them will become apparent from the descriptions of example embodiments herein below with reference to the accompanying drawings. However, the present disclosure is not limited to example embodiments disclosed herein but may be implemented in various different ways. The example embodiments are provided for making the disclosure of the present disclosure thorough and for fully conveying the scope of the embodiments of the present disclosure to those skilled in the art. It is to be noted that the scope of the embodiments of the present disclosure is defined only by the claims.

The figures, dimensions, ratios, angles, numbers of elements given in the drawings are merely illustrative and are not limiting. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the embodiments of the present disclosure.

Like reference numerals denote like elements throughout the descriptions.

The width in the cross section of an element refers to the width in the middle of the height of the cross section throughout the descriptions.

The angle of an element refers to an angle made by a plane and a sloped surface in the middle of the height of the cross section throughout the descriptions.

The drawings are not to scale and the relative dimensions of various elements in the drawings are depicted schematically and not necessarily to scale.

Features of various example embodiments of the present disclosure may be combined partially or totally. As will be clearly appreciated by those skilled in the art, technically various interactions and operations are possible. Various example embodiments can be practiced individually or in combination.

Figure 2:
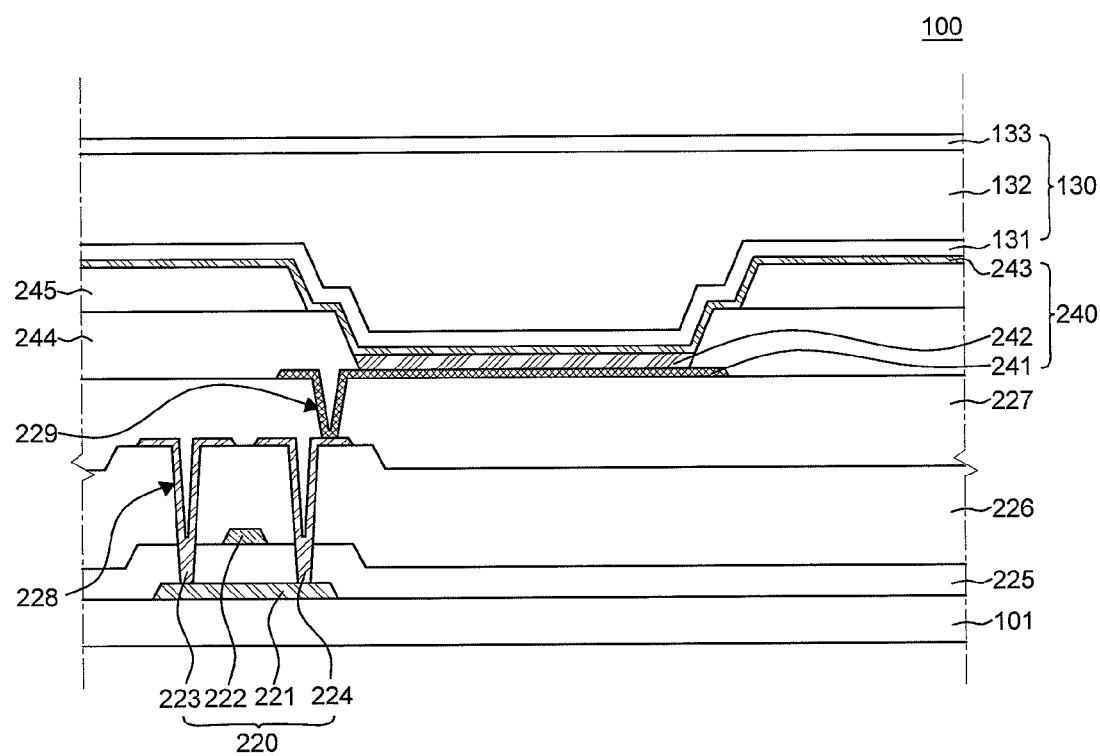
FIG. 2 is a schematic cross-sectional view of a sub-pixel of one of a plurality of pixels illustrated in FIG. 1.
Figure 3:
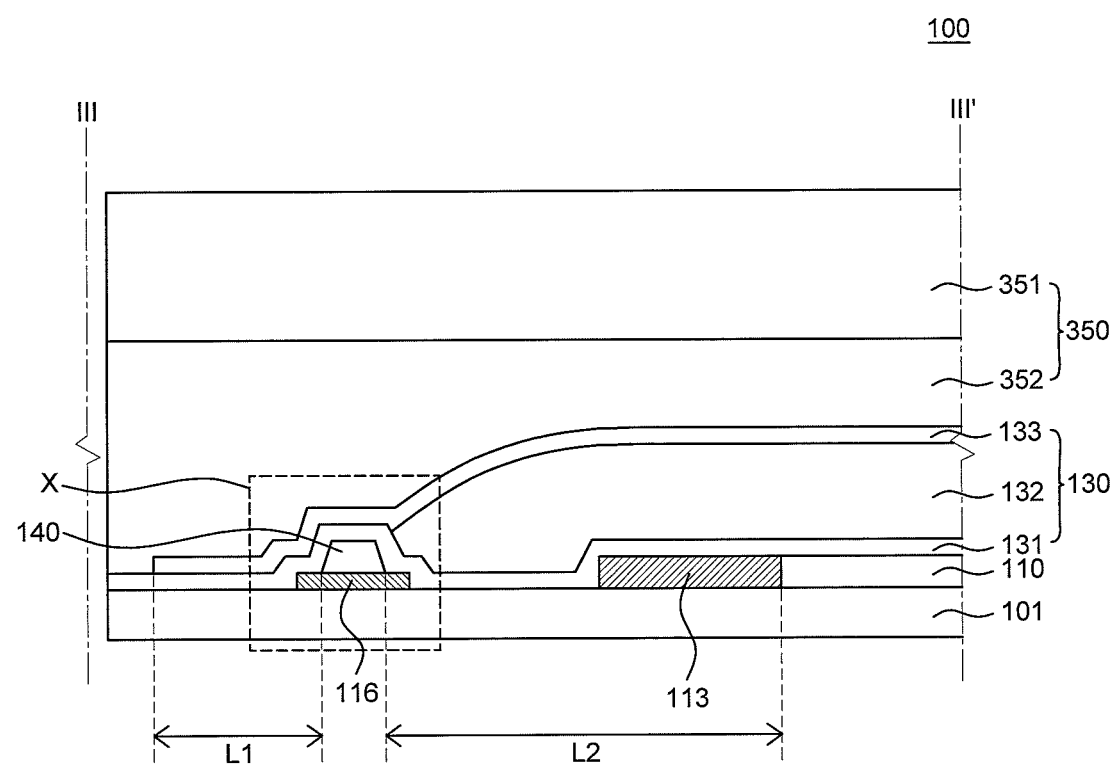
FIG. 3 is a schematic cross-sectional view of the OLED device taken along line III-III' illustrated in FIG. 1.
Figure 4:
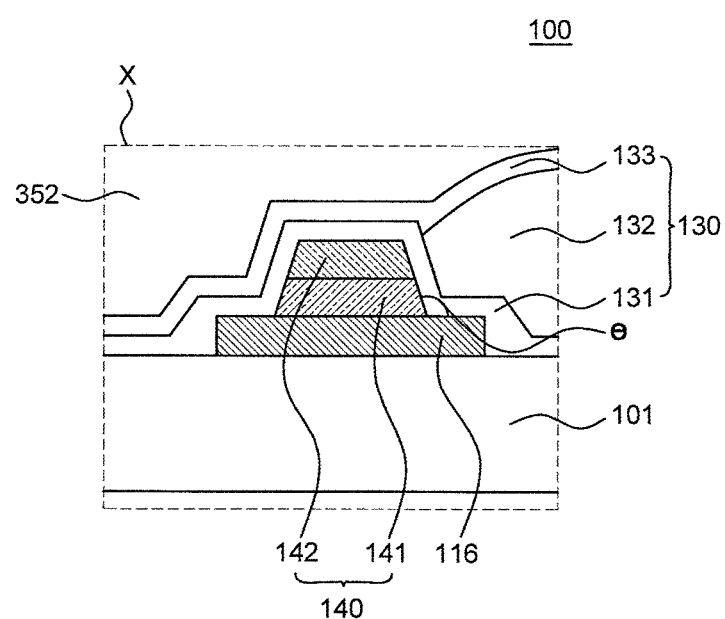
FIG. 4 is an enlarged view of area X illustrated in FIG. 3.

FIG. 1 is a schematic plan view of an OLED device according to an example embodiment of the present disclosure. FIG. 2 is a schematic cross-sectional view of a sub-pixel of one of a plurality of pixels illustrated in FIG. 1. FIG. 3 is a schematic cross-sectional view of the OLED device taken along line illustrated in FIG. 1. FIG. 4 is a schematic enlarged view of area X illustrated in FIG. 3.

An OLED device according to an example embodiment of the present disclosure includes a pixel area including a plurality of pixels, a flexible encapsulation unit protecting the pixel area, and a barrier film covering the flexible encapsulation unit. The flexible encapsulation unit includes a first encapsulation layer formed in the pixel area and a non-pixel area, a structure formed in the non-pixel area and surrounding the pixel area, a particle cover layer formed inside the structure, and a second encapsulation layer formed on the first encapsulation layer and the particle cover layer. The barrier film is attached on the flexible encapsulation unit by a pressure-sensitive adhesive layer.

Hereinafter, a top emission OLED device capable of suppressing a particle cover layer from being excessively spread according to an example embodiment of the present disclosure will be described with reference to FIGS. 1 to 4.

Referring to FIG. 1, an OLED device 100 includes: a plurality of pixels 111 disposed on a flexible substrate 101; a gate driver 113 configured to drive a plurality of gate lines 112; a data driver 115 configured to apply an image signal to a plurality of data lines 114; a common voltage line 116 disposed at the outer periphery of the gate driver 113 to apply common voltage Vss to the plurality of pixels 111, and a flexible encapsulation unit 130.

Each of the plurality of pixels 111 includes sub-pixels emitting light of red, green and blue (RGB) colors. Each of the plurality of pixels 111 may further include a sub-pixel emitting light of white color. Each of the sub-pixels may further include a color filter. The plurality of pixels 111 is driven by thin-film transistors connected to the plurality of gate lines 112 and the plurality of data lines 114 intersecting each other. The area where the plurality of pixels 111 is disposed may be referred to as a pixel area 110.

The data driver 115 generates a gate start pulse (GSP) for driving the gate driver 113 and a variety of clock signals. Further, the data driver 115 converts a digital image signal received from an external source into an analog image signal using a gamma voltage generated in a gamma voltage generator, and applies it to the plurality of pixels 111 via the plurality of data lines 114. The data driver 115 may be mounted on the substrate 101 by an anisotropic conductive film (ACF) applied onto a plurality of pads formed on the substrates 101. In addition, a flexible printed circuit (FPC), a cable, etc., may be mounted on another plurality of pads for receiving an image signal and a control signal from an external source by an ACF. The area where the pluralities of pads are formed, on which the data driver 115, the FPC, etc., are mounted, may be referred to as a pad area 120. The ACF can be replaced with a conductive adhesive or conductive paste and the embodiments of the present disclosure are not limited by the types of the conductive adhesive means.

The gate driver 113 includes a plurality of shift registers. Each of the shift registers is connected to the respective gate lines 112. The gate driver 113 receives a gate start pulse (GSP) and a variety of clock signals from the data driver 115. As the shift registers in the gate driver 113 shifts gate start pulses sequentially, each of the plurality of pixels 111 connected to the respective gate lines 112 is activated. The non-pixel area corresponds to the area around the pixel area 110 including the area where the gate driver 113 is formed, except the pad area 120.

The common voltage line 116 may be made of the same material as that of the gate lines 112 and/or the data lines 114 as a single layer or a multilayer. An insulating layer may be formed on the common voltage line 116. The common voltage line 116 may supply a common voltage to a second electrode of each of the plurality of pixels 111. As illustrated in FIG. 1, the common voltage line 116 is formed at the outer side of the pixel area 110 and the gate driver 113 to surround them. For a top emission OLED device, the second electrodes in the pixel area 110 have high electric resistance. Accordingly, there is a problem in that the resistance of the second electrode increases as it becomes more distant from the common voltage line 116. In order to help relieve this problem, the common voltage line 116 is disposed to surround the pixel area 110. However, this is merely illustrative, and the common voltage line 116 may be formed on at least one side of the pixel area 110. To electrically connect the second electrodes of the plurality of pixels 111 to the common voltage line 116, the second electrodes may be formed on the gate driver 113 to be extended to a part of the gate driver 113. Further, the second electrodes may be connected to a connecting unit made of the same material as that of the first electrodes formed on the gate driver 113. The connecting unit made of the same material as that of the first electrodes may be formed over the gate driver 113 and may be connected to the common voltage line 116 over the gate driver 113. If there is an insulating layer between the connecting unit and the common voltage line 116, the connecting unit and the common voltage line 116 may be connected to each other via a contact hole.

The flexible encapsulation unit 130 is formed to cover the pixel area 110 and non-pixel area. In addition, the flexible encapsulation unit 130 is formed not to cover the pad area 120. Specifically, the flexible encapsulation unit 130 effectively protects the moisture permeation and also has good electrical insulating property. Accordingly, in case the flexible encapsulation unit 130 covers the pad area 120, the plurality of pads formed on the pad area 120 may be insulated. For this reason, it is desired that the flexible encapsulation unit 130 is not formed on the pad area 120.

The flexible encapsulation unit 130 includes a first encapsulation layer 131, a second encapsulation layer 133, a structure 140 and a particle cover layer 132. In particular, in order to suppress the particle cover layer 132 from being excessively spread, the structure 140 is formed in the non-pixel area to surround the pixel area 110. In embodiments of the present disclosure, references to excessive spread refers to avoiding or reducing overflow of the particle cover layer 132 over the structure 140. In other words, the structure 140 is arranged to contain or limit the particle cover layer 132. The structure 140 surrounds the pixel area 110 and the gate driver 113. The structure 140 partially overlaps the common voltage line 116. However, the structure 140 may be formed on inner or outer side of the common voltage line 116 rather than on the common voltage line 116. The structure 140 may also be formed on the gate driver 113 instead of the common voltage line 116. That is, the structure 140 may be disposed anywhere in the non-pixel area as long as it surrounds the pixel area 110. The flexible encapsulation unit 130 will be described in more detail with reference to FIG. 3. In embodiments of the present disclosure, reference is made to the structure 140 containing or limiting the particle cover layer 132. In other embodiments of the present disclosure, use of the structure 140 is applicable to instances of use for material, such as particle cover layer.

Referring to FIG. 2, the OLED device 100 includes a substrate 101 made of a flexible material, a thin-film transistor 220 disposed on the substrate 101, an organic light-emitting element 240 driven by the thin-film transistor 220, and a flexible encapsulation unit 130 sealing the organic light-emitting element 240.

The substrate 101 may be a flexible film such as a polyimide-based material. In addition, a back plate for supporting the OLED device 100 may be provided on the rear surface of the substrate 101 to suppress the OLED device 100 from being too flappy. Further, multiple buffer layers made of silicon nitride $SiN_x$ and silicon oxide $SiO_x$ may be disposed between the substrate 101 and the thin-film transistor 220, thereby protecting moisture and/or oxygen permeation into the substrate 101.

The thin-film transistor 220 includes an active layer 221, a gate electrode 222, a source electrode 223 and a drain electrode 224. The active layer 221 is covered by a gate insulating film 225 formed on the front surface of the substrate 101. The gate electrode 222 is made of the same material as that of the gate line 112 and is formed on the gate insulating film 225 over at least a part of the active layer 221. The gate electrode 222 is covered by an interlayer insulating film 226 formed on the front surface of the gate insulating film 225. The interlayer insulating film 226 may be formed in a multilayer structure of silicon nitride and silicon oxide. The thickness of the silicon nitride is between 0.2 µm and 0.4 µm, and the thickness of silicon oxide is, preferably, between 0.15 µm and 0.3 µm. More preferably, the thickness of silicon nitride is 0.3 µm, and the thickness of silicon oxide is 0.2 µm, and thus, the thickness of the interlayer insulating film 226 is 0.5 µm. The source electrode 223 and the drain electrode 224 are made of the same material as that of the data line 114 and are formed on the interlayer insulating film 226 spaced apart from each other. The source electrode 223 is connected to one end of the active layer 221 via a first contact hole 228 passing through the gate insulating film 225 and the interlayer insulating film 226. The drain electrode 224 is disposed over at least the other end of the active layer 221 and is connected to the active layer 221 via a first contact hole 228 passing through the gate insulating film 225 and the interlayer insulating film 226. The thin-film transistor 220 including the active layer 221 is covered by a planarizing layer 227 formed on the front surface of the interlayer insulating film 226. Additionally, an insulating layer made of silicon nitride for protecting the thin-film transistor 220 from contamination may be formed between the interlayer insulating film 226 and the planarizing layer 227. The structure of the thin-film transistor 220 is not limited to that described above but various types of structure may be employed.

The organic light-emitting element 240 includes a first electrode 241, a second electrode 243 facing the first electrode 241, and an organic light-emitting layer 242 disposed between them. A light-emitting area of the organic light-emitting layer 242 may be defined by a bank 244.

The first electrode 241 is disposed on the planarizing layer 227 in the light-emitting area of each of the pixels 111, and is connected to the drain electrode 224 of the thin-film transistor 220 via a second contact hole 229 passing through the planarizing layer 227. The planarizing layer 227 may be made of photo acryl having low dielectric permittivity. The thickness of the planarizing layer 227 is preferably between 2 µm and 3.5 µm, more preferably 2.3 µm. By the planarizing layer 227 made of the material at the thickness, the first electrode 241 is less affected by parasitic capacitance generated by the thin-film transistor 220, the gate line 112 or the data line 115. Further, the evenness of the first electrode can be improved.

The bank 244 is formed in a tapered shape on the planarizing layer 227 in the non-emitting area of each of the pixels 111. The bank 244 is formed on the edge of the first electrode 241, overlapping at least a part thereof. The height of the bank 244 is preferably between 1 µm and 2 µm, more preferably 1.3 µm. A spacer 245 is formed on the bank 244. The spacer 245 may be made of the same material as that of the bank 244. The bank 244 and the spacer 245 may be made of polyimide. The space 245 serves to protect the organic light-emitting element 240 from being damaged by a fine metal mask (FMM) used in patterning the organic light-emitting layer 242. The height of the spacer 245 is preferably between 1.5 µm and 2.5 µm, more preferably 2 µm. With the spacer 245 having such height, the organic light-emitting element 240 can be protected from being damaged by the mask. The spacer 245 may be formed without using a fine metal mask patterning.

In addition, since the heights of the planarizing layer 227, the bank 244 and the spacer 245 are also related to the height of the structure 140 described below, the height of the structure 140 may be determined by taking the thickness of the particle cover layer 132 into account.

The organic light-emitting layer 242 is formed on the first electrode 241. The second electrode 243 is formed such that it faces the first electrode 241 with the organic light-emitting layer 242 therebetween. The organic light-emitting layer 242 may be made of phosphor or fluorescent material, and may further include an electron transport layer, a hole transport layer, a charge generation layer and etc.

The first electrode 241 may be made of a metal material having a high work function. The first electrode 241 may be made of a reflective material so that it has a reflective property or a reflective plate may be additionally disposed under the first electrode 241. To the first electrode 241, an analog image signal is applied to display an image.

The second electrode 243 is made of a very thin, metal material having a lower work function or a transparent conductive oxide (TCO). If the second electrode 243 is made of a metal material, it has a thickness equal to or less than 400 Å. With such a thickness, the second electrode 243 is a transflective (semitransparent) layer, and thus, the second electrode 243 is regarded as a substantially transparent layer. To the second electrode 243, the common voltage Vss is applied.

On the second electrode 243, a flexible encapsulation unit including a first encapsulation layer, a particle cover layer, and a second encapsulation layer 133 are formed. The flexible encapsulation unit 130 will be described in more detail with reference to FIG. 3.

FIG. 3 illustrates a part of the OLED device 100, from the pixel area 110 to an edge of the OLED device 100. Specifically, a substrate 101, a pixel area 110 formed on the substrate 101, a gate driver 113 formed on a non-pixel area, a common voltage line 116 formed on the non-pixel area, a flexible encapsulation unit 130 covering the pixel area 110 and the non-pixel area, and a barrier film 350 are illustrated.

The gate driver 113 is composed of thin-film transistors which are formed with the thin-film transistors 220 which are included in the plurality of pixels 111 during the same manufacturing process. Therefore, the layered structure of the gate driver 113 will not be described to avoid redundancy.

A structure 140 may be formed on the common voltage line 116. The height of the structure 140 is increased by the thickness of the common voltage line 116. Detailed description of the elements described above with respect to FIG. 1 will be omitted to avoid redundancy.

The flexible encapsulation unit 130 includes a first encapsulation layer 131, a particle cover layer 132, a second encapsulation layer 133 and a structure 140. The first encapsulation layer 131 is configured to cover the plurality of pixels 111, the gate driver 113, and the structure 140. The particle cover layer 132 covers the pixel area 110, while suppressed from being excessively spread by the structure 140. Thus, the particle cover layer 132 comes to abut the structure 140. The second encapsulation layer 133 is configured to cover the first encapsulation layer 131 and the particle cover layer 132. The structure 140 has a particular height and surrounds the particle cover layer 132 in the non-pixel area. The structure 140 has such a height that it suppresses the particle cover layer 132 from being excessively spread, and increases the adhesion between the barrier film 350 and the flexible encapsulation unit 130.

The first encapsulation layer 131 is made of an inorganic substance. The first encapsulation layer 131 may be formed with silicon nitride $SiN_x$ or aluminum oxide $Al_yO_z$ by using, but is not limited to, vacuum film deposition techniques such as a chemical vapor deposition (CVD), an atomic layer deposition (ALD), etc.

In case the encapsulation layer 131 is made of silicon nitride, the thickness of the first encapsulation layer 310 is preferably between 5,000 Å and 15,000 Å, more preferably 10,000 Å. The water vapor transmission rate (WVTR) measurement was conducted on the first encapsulation layer 131 having the thickness of 10,000 Å, and as a result, the WVTR was measured to be $5.0 \times 10^{-2}$ g/m$^2$/day.

In case the encapsulation layer 131 is made of aluminum oxide, the thickness of the first encapsulation layer 131 is preferably between 200 Å and 1,500 Å, more preferably 500 Å. The WVTR measurement was conducted on the first encapsulation layer 131 having the thickness of 500 Å, and as a result, the WVTR was measured to be $1.3 \times 10^{-3}$ g/m$^2$/day.

The particle cover layer 132 is made of an organic substance. The particle cover layer 132 may be made of, but is not limited to, silicon oxycarbide ($SiOC_z$) or an acryl-based or epoxy-based resin. A viscosity of the particle cover layer 132 for effectively covering foreign matter is preferably between 500 centipoises (cps) and 30,000 cps, and more preferably between 2,000 cps and 4,000 cps.

For example, in case the particle cover layer 132 is made of $SiOC_z$, the particle cover layer 132 may be formed by a CVD process. $SiOC_z$ is normally an inorganic substance but can be regarded as an organic substance under a particular configuration. Specifically, the flowability of $SiOC_z$ differs depending on the ratio between carbon atoms and silicon atoms (C/Si). For example, $SiOC_z$ with lower flowability acts like an inorganic substance, so that it covers foreign matter less effectively. On the other hand, $SiOC_z$ with higher flowability acts like an organic substance, so that it covers foreign matter more effectively. The flowability was measured by varying the ratio between the atoms. The result indicates that the flowability decreases if the ratio between C/Si is equal to or higher than approximately 1.05, and the flowability increases if the ratio between C/Si is equal to or less than 1.0. Accordingly, foreign matter can be easily covered if the ratio between C/Si is equal to or less than 1.0. Accordingly, the ratio between C/Si of $SiOC_z$ of the particle cover layer 132 is preferably 1.0 or less. In addition, by controlling the temperature of deposition process to be 60° C. or less, the flowability is increased, so that the evenness of the particle cover layer 132 improves, and thus, can cover foreign matter easily. Accordingly, the second encapsulation layer 133 can be formed on the even surface of the particle cover layer 132.

The ratio between C/Si of $SiOC_z$ may be controlled by adjusting the ratio between oxygen $O_2$ and hexamethyldisiloxane (HMDSO) during a CVD process. The thickness of the particle cover layer 132 made of $SiOC_z$ is preferably between 2 μm and 4 μm, more preferably 3 μm. In particular, in case the particle cover layer 132 is made of $SiOC_z$, the flexible encapsulation unit 130 can be very thin, thus the OLED device 100 can be thinner.

For example, in case the particle cover layer 132 is made of an acryl-based or an epoxy-based resin, the particle cover layer 132 may be formed by slit coating or screen printing process. In this case, as the epoxy-based resin, high-viscosity bisphenol-A based epoxy or low viscosity bisphenol-F based epoxy may be applicable. The particle cover layer 132 may further include additive agents. For example, a wetting agent for reducing the surface tension of the resin to improve uniformity of the resin, a leveling agent for improving the surface evenness of the resin, and a defoaming agent for removing foams in the resin may be added as the additive agents. The particle cover layer 132 may further include an initiator. For example, an antimony-based initiator or an anhydride-based initiator may be applicable that initiates a chain reaction by heat to cure a liquid resin.

In particular, when the resin is thermally cured, it is important to control the processing temperature to be below 110° C. In case the resin is thermally cured above 120° C., the already formed, organic light-emitting layer 242 may be damaged. Accordingly, a resin that is cured below 110° C. is used.

Additionally, as the temperature of the resin increases, the viscosity of the liquid resin rapidly becomes low, and after a while, the viscosity rapidly becomes high as the resin is cured. However, while the viscosity of the resin is low, the flowability is too high. Therefore, excessive spread is especially highly likely to occur during this time.

The thickness of the particle cover layer 132 made of a resin may be between 15 μm and 25 μm, preferably 20 μm.

As illustrated in FIG. 3, the cross section of the particle cover layer 132 has an even upper surface in the pixel area 110 and the thickness of the particle cover layer 132 becomes gradually thinner in the non-pixel area. The portion of the particle cover layer 132 that becomes gradually thinner has a slope which may refract light, deteriorating the image quality. Accordingly, the portion of the particle cover layer 132 that becomes gradually thinner is preferably located in the non-pixel area.

The particle cover layer 132 serves to cover foreign matter or particles that may be occurred during manufacturing processes. For example, there may be a defect in the first encapsulation layer 131 due to a crack caused by foreign matter or particles. The particle cover layer 132 may cover such an irregular surface or foreign matter, so that the top surface of the particle cover layer 132 becomes even. That is, the particle cover layer 132 compensates the foreign matters and planarizes the pixel area 110 to the plurality of pixels 111. Consequently, the particle cover layer 132 can be also referred as the compensation layer. Also, the height of the particle cover layer 132 is gradually decreased from the outer periphery of the plurality of pixel 111 toward the structure 140.

However, the particle cover layer 132 is not suitable for protecting the organic light-emitting element 240 from moisture. Additionally, since the particle cover layer 132 has high flowability, it frequently deviates from the designed values.

The structure 140 according to an example embodiment of the present disclosure is formed in the non-pixel area of the OLED device 100. The structure 140 is spaced apart from the pixel area 110 and is spaced apart from the outermost periphery of the substrate 101. As illustrated in FIG. 3, the flow of the particle cover layer 132 is suppressed by the structure 140.

Referring to FIG. 4, the structure 140 has a multilayer structure of a first layer 141 and a second layer 142, for suppressing the particle cover layer 132 from being excessively spread. The first layer 141 and the second layer 142 are formed while the bank 244 and the spacer 245 are formed during the same process. That is, the structure 140 may be formed in a multilayer structure having a height between 2.5 μm and 4.5 μm by a design alteration of a mask without undergoing any additional process. In other words, the height of the structure 140 can be varied depending on design of the bank 244 and the spacer 245. As described above, in case the heights of the bank 244 and the spacer 245 are 1.3 μm and 2 μm, respectively, the height of the multilayer structure 140 is 3.3 μm. In particular, such a height of the structure 140 is optimized for the plurality of pixels 111. In embodiments of the present disclosure, the structure 140 may include at least one of an organic material and an inorganic material, and the first encapsulation layer 131 covering the structure 140 resists penetration of moisture through the structure 140.

The first encapsulation layer 131 is formed on the structure 140 conforming to the shape of the structure 140. The slope θ of the wall of the first encapsulation layer 131 formed on the structure 140 is equal to the slope in the cross section of the first layer 141 and the second layer 142. The gradient of the slope of the bank 244 and the spacer 245 in the cross section may range from 30° to 90° with respect to the substrate 101. The slope of the bank 244 may be equal to or different from that of the spacer 245.

In case the particle cover layer 132 is made of $SiOC_z$, the height of the structure 140 is similar to the height of the particle cover layer 132, so that it is possible to effectively suppress the particle cover layer 132 from being excessively spread. The particle cover layer 132 is formed such that conforming to the wall of the first encapsulation layer 131 formed on the structure 140. That is, the particle cover layer 132 has a corresponding shape according to the shape of the wall of the first encapsulation layer 131.

In addition, if the structure 140 is higher than the particle cover layer 132 adjacent thereto, the structure 140 is capable of suppressing overflow of the particle cover layer 132. Accordingly, the structure 140 can be formed close to the pixel area 110 as much as possible. In this case, it is desirable to form the structure 140 spaced apart from the pixel area 110 by a distance L2 equal to or less than 1,000 μm.

In case the particle cover layer 132 is made of an acryl-based or epoxy-based resin, the height of the particle cover layer 132 may be between 15 μm and 25 μm. Accordingly, the height of the particle cover layer 132 is higher than the height of the structure 140. As described above, the upper surface of the particle cover layer 132 is even within the pixel area 110 and the height of the particle cover layer 132 is gradually decreased within the non-pixel area. In this case, it is preferably to form the particle cover layer 132 at a position where the height of the particle cover layer 132 becomes lower to be equal to the height of the structure 140, so that the structure 140 can effectively suppress the particle cover layer 132.

For example, if an epoxy-based resin used in an example embodiment of the present disclosure has the thickness of 20 μm and the viscosity of 3,000 cps, it is desirable to form the structure 140 spaced apart from the pixel area 110 by 1,000 μm to 2,500 μm, which is regarded as an optimal distance for this example. That is, at the particular distance L2 which is regarded as the optimal distance, the structure 140 can effectively suppress the particle cover layer 132 from overflowing. Therefore, it is important to keep the distance L2 for this example. However, the distance is not limited to the above example since the configuration varies depending on the height of the structure 140, the thickness and viscosity of the particle cover layer 132, and the area where it is applied.

In addition, the particle cover layer 132 may not flow over the structure 140 even if the structure 140 is slightly lower than the particle cover layer 132, as the particle cover layer 132 has a certain surface tension.

The second encapsulation layer 133 is formed on the particle cover layer 132 and the first encapsulation layer 131. The first encapsulation layer 131 comes in contact with the second encapsulation layer 133 at the outer side of the structure 140. The length L1 of the area where the first encapsulation layer 131 comes in contact with the second encapsulation layer 133 at the outer side of the structure 140 is preferably 50 μm or greater. That is, the area where the first encapsulation layer 131 comes in contact with the second encapsulation layer 133 for sealing the particle cover layer 132 is extended from the outer periphery of the structure by a distance. In particular, as the first encapsulation layer 131 is configured to be in contact with the second encapsulation layer 133 at least 50 μm, the particle cover layer 132 can be sealed by the first encapsulation layer 131 and the second encapsulation layer 133 even if the particle cover layer 132 flows over the structure 140. With this configuration, the particle cover layer 132 is sealed by the first encapsulation layer 131 and the second encapsulation layer 133, so that the direct path of moisture permeation via the particle cover layer 132 is suppressed. In this case, the first encapsulation layer 131 is larger than the second encapsulation layer 133. Accordingly, the area of the second encapsulation layer 133 may be smaller than that of the first encapsulation layer 131. However, the embodiments of the present disclosure are not limited to the length L1 or the area of the first encapsulation layer 131 and the area of the second encapsulation layer 133.

Further, as the second encapsulation layer 133 is formed on the even surface, which is the upper surface of the particle cover layer 132, it is possible to significantly reduce cracks or seams due to foreign matter and an irregular surface. Specifically, the second electrode 243 is formed conforming to the bank 244 and the spacer 245. Accordingly, the second electrode 243 does not have an even surface. As the first encapsulation layer 131 is formed conforming to the irregular surface of the second electrode 243, the first encapsulation layer 131 may have cracks due to the irregular surface. In contrast, the second encapsulation layer 133 has an even surface. Accordingly, the second encapsulation layer 133 may have fewer cracks than the first encapsulation layer 131.

As illustrated in FIG. 3, after the second encapsulation layer 133 is formed, the barrier film 350 is attached on the second encapsulation layer 133. By the barrier film 350, the OLED device 100 can further protect the oxygen and moisture permeation. In particular, the process of attaching the barrier film 350 need not be carried out under strict vacuum conditions like a CVD process or an ALD process, but the barrier film 350 can be attached via a simple roll-to-roll laminating process while effectively protecting oxygen and moisture permeation by the flexible encapsulation unit 130. Accordingly, it is possible to avoid cumbersome repetitions of depositing organic insulating layers and inorganic insulating layers under vacuum conditions for suppressing damages on the organic light-emitting element 240 by oxygen and moisture, so that the process time can be significantly reduced and manufacturing cost can be drastically saved. In addition, without the barrier film adhered by a roll-to-roll process, more encapsulation layers made of an inorganic substance may be required. Therefore, cracks are made easier in the flexible encapsulation unit as inorganic substance tends to be brittle by bending. However, by using the barrier film 350, the number of the layers of the inorganic substance deposited by a CVD can be reduced while effectively suppressing moisture permeation. As a result, the good flexible encapsulation unit 130 can be implemented. However, the embodiments of the present disclosure are not limited by the barrier film.

The barrier film 350 includes a barrier film body 351 and a pressure-sensitive adhesive layer 352. The barrier film body 351 may be made of, but is not limited to, one of a copolyester thermoplastic elastomer (COP), a cycoolefin copolymer (COC) and a polycarbonate (PC). The barrier film 350 has to transmit image in the pixel area 110, and thus, preferably has optically isotropic properties in order to maintain the quality of displayed images.

The thickness of the barrier film body 351 is preferably between 35 μm and 60 μm, more preferably 50 μm. With such a thickness, WVTR of the barrier film 350 was measured to be $5\times10^{-3}$ g/m$^2$/day.

The capability of protecting the moisture permeation of the OLED device 100 is determined based on the overall WVTR, taking into account WVTRs of the first encapsulation layer 131, the second encapsulation layer 133 and the barrier film 350. Accordingly, in order to improve the WVTR of the OLED device 100, the relationship with the barrier film 350 is also important, as well as the first encapsulation layer 131 and the second encapsulation layer 133.

Specifically, the thickness of the barrier film 350 may be determined taking into account the encapsulation performance of the first encapsulation layer 131 and the second encapsulation layer 133. For example, in case the encapsulation performance of the first encapsulation layer 131 and the second encapsulation layer 133 are improved, the thinner the barrier film 350 can be applied.

The pressure-sensitive adhesive layer 352 is made of a transparent, two-sided adhesive film. In addition, the structure 140 is configured to provide additional pressure to a corresponding portion of the pressure-sensitive adhesive layer 352 while the barrier film is laminated by a roll-to-roll process. As the height of the structure increases, the additional pressure can be increased. The pressure-sensitive adhesive layer 352 may be made of an insulative material such as olefin-based, acryl-based, and silicon-based materials. The pressure-sensitive adhesive layer 352 may have a thickness between 8 μm and 50 μm. In particular, the pressure-sensitive adhesive layer 352 may be made of a hydrophobic, olefin-based material that protects the moisture permeation. The pressure-sensitive adhesive layer 352 has the nature that its adhesion is increased if pressed at a constant pressure. If the pressure-sensitive adhesive layer 352 is made of a hydrophobic, olefin-based insulative material, the pressure-sensitive adhesive layer 352 has a WVTR of 10 g/m$^2$/day or less. In this manner, in addition the first encapsulation layer 131, the second encapsulation layer 133 and the barrier film body 351, the oxygen and moisture permeation into the pixel area 110 can be further protected even by the pressure-sensitive adhesive layer 352. As a result, the life span and reliability of the OLED device 100 can be improved.

An OLED device according to another example embodiment of the present disclosure includes a structure having a different configuration from that described above with respect to the above example embodiment.

Hereinafter, a top emission OLED device according to another example embodiment of the present disclosure will be described with reference to FIGS. 5A and 5B, which is capable of suppressing the particle cover layer from being excessively spread.

Figure 5A:
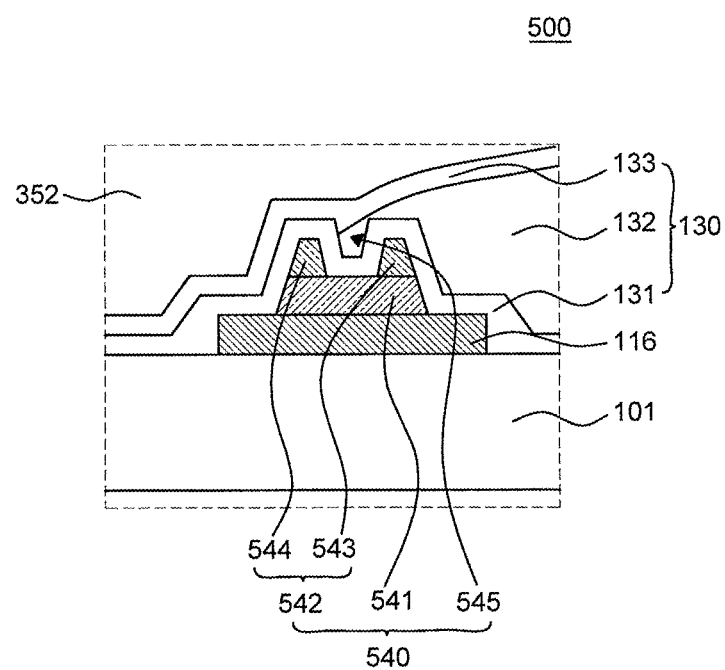
FIG. 5A is a schematic enlarged view of an OLED device according to another example embodiment of the present disclosure.

FIG. 5A is a simplified enlarged view of an OLED device according to another example embodiment of the present disclosure. FIG. 5B is a schematic plan view for illustrating effects of a structure in an OLED device according to another example embodiment of the present disclosure.

Referring to FIG. 5A, a structure 540 in an OLED device 500 includes a first layer 541 and a second layer 542. The first layer 541 is a single layer. The second layer 542 on the first layer 541 includes a plurality of subsidiary structures 543 and 544. That is, the second layer 542 located on the top of the multilayer structure 540 includes the plurality of subsidiary structures 543 and 544. A storage space 545 is defined between the subsidiary structures 543 and 544 spaced apart from each other. The storage space 545 surrounds the pixel area 110. The storage space 545 may act as a channel or a canal, configured to disperse a particle cover layer 132 when the particle cover layer 132 overflows the subsidiary structure 543. During the process of forming the channel, a part of the first layer 541 may be etched to further deepen the storage space 545.

The width in the cross section of the first layer 541 is preferably between 30 μm and 120 μm, more preferably between 40 μm and 50 μm. The width in the cross section of the storage space 545 of the second layer 542 is preferably between 10 μm and 30 μm, more preferably 20 μm. The width in the cross section of the plurality of subsidiary structures 543 and 544 of the second layer is 10 μm. That is, the width in the cross section of the second layer 542 located on the top of the multilayer structure 540 is narrower than that of the first layer 541 located on the bottom thereof.

The widths in the cross sections of the plurality of subsidiary structures 543 and 544 of the second layer 542 may differ from each other. For example, the inner subsidiary structure 543 that is closer to the outer periphery of the pixel area 110 may have a wider cross section than the outer subsidiary structure 544 because the subsidiary structure 543 has to bear the weight of the particle cover layer 132, like a dam for storing water.

By varying factors related to the storage space 545, the particle cover layer 132 can be more effectively dispersed.

For example, by forming the plurality of subsidiary structures 543 and 544 defining the storage space 545 closely to each other, capillary action can be more easily induced, so that the particle cover layer 132 can be dispersed more quickly via the storage space 545. Capillary action is the ability of a liquid to flow in a narrow pipe without the assistance of, and in opposition to gravity.

For example, the viscosity of the particle cover layer 132 may be lowered. As the viscosity of the particle cover layer 132 becomes low, the particle cover layer 132 can be dispersed more quickly via the storage space 545.

For example, by adding a wetting agent to the particle cover layer 132 in order to change its surface tension and in turn its wettability, the particle cover layer 132 can be dispersed more quickly via the storage space 545.

The plurality of subsidiary structures 543 and 544 is especially effective when it is required to reduce the distance between the structure 540 and the pixel area 110 in order to make a narrow bezel.

Figure 5B:
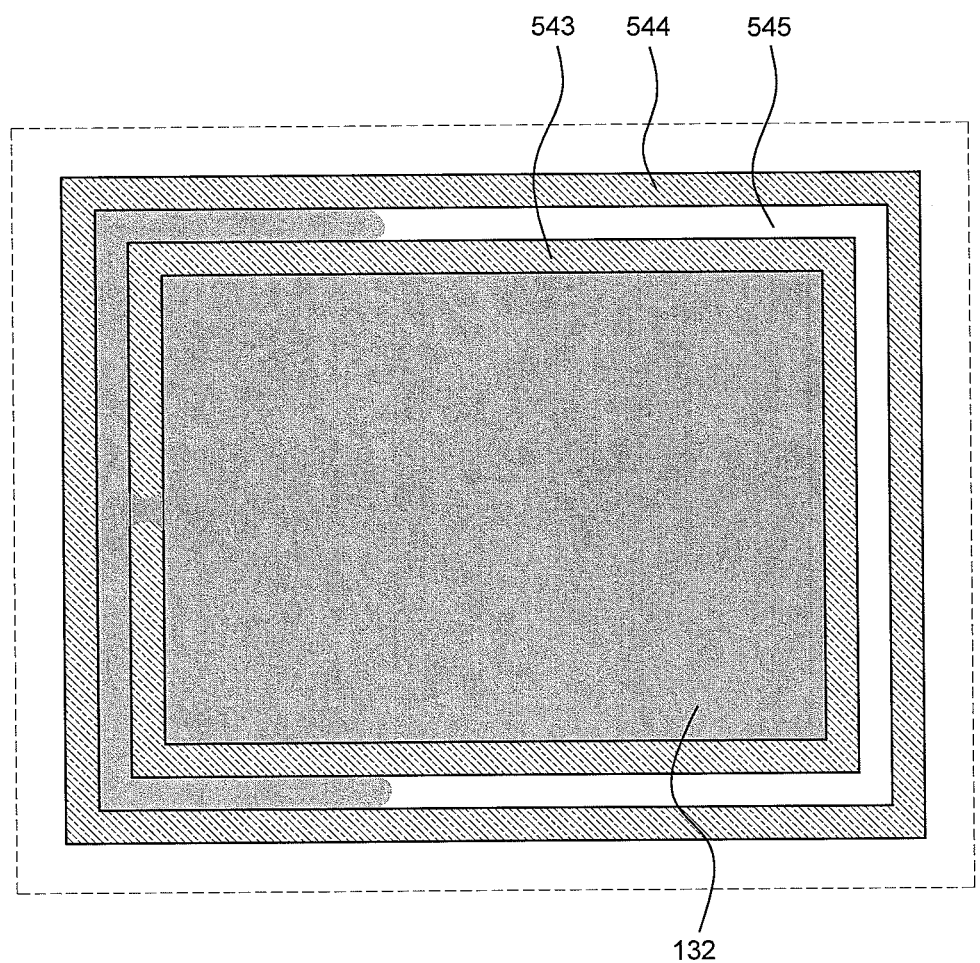
FIG. 5B is a schematic plan view for illustrating effects of a structure in an OLED device according to another example embodiment of the present disclosure.

Referring to FIG. 5B, if the particle cover layer 132 flows over the inner subsidiary structure 543, the particle cover layer 132 is dispersed into two ways along the storage space 545. Accordingly, the particle cover layer 132 is stored in the storage space 545 inside the subsidiary structures 543 and 544, and thus, it is possible to effectively suppress the particle cover layer 132 from flowing over the outer subsidiary structure 544 of the structure 540.

Preferably, the storage space 545 surrounds all four sides of the pixel area of the OLED device 500. With this configuration, even if the particle cover layer 132 flows over one of the four sides, the particle cover layer 132 can be effectively dispersed by the storage space 545 formed along the four sides.

With the exception of the portions explained above, the OLED device 500 according to another embodiment is identical to the OLED device 100 of a previous embodiment, and thus, redundant features will not be described for the sake of brevity.

An OLED device according to yet another example embodiment of the present disclosure includes a structure with a different configuration from that described above with respect to the above example embodiments.

Hereinafter, a top emission OLED device according to another example embodiment of the present disclosure will be described with reference to FIGS. 6A and 6B, which is capable of suppressing the particle cover layer from being excessively spread.

Figure 6A:
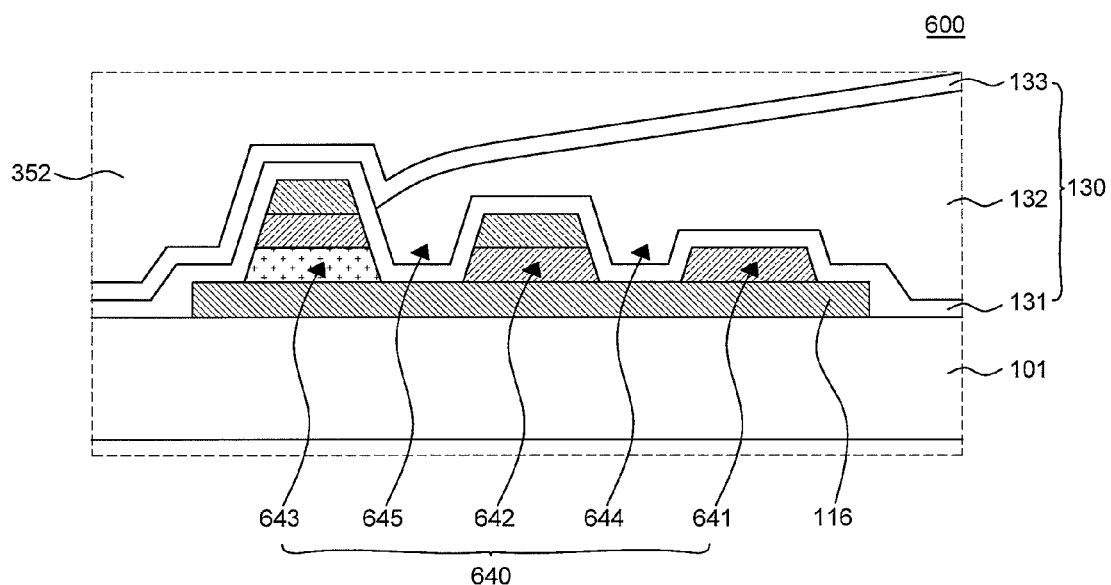
FIG. 6A is a schematic enlarged view of an OLED device according to yet another example embodiment of the present disclosure.
Figure 6B:
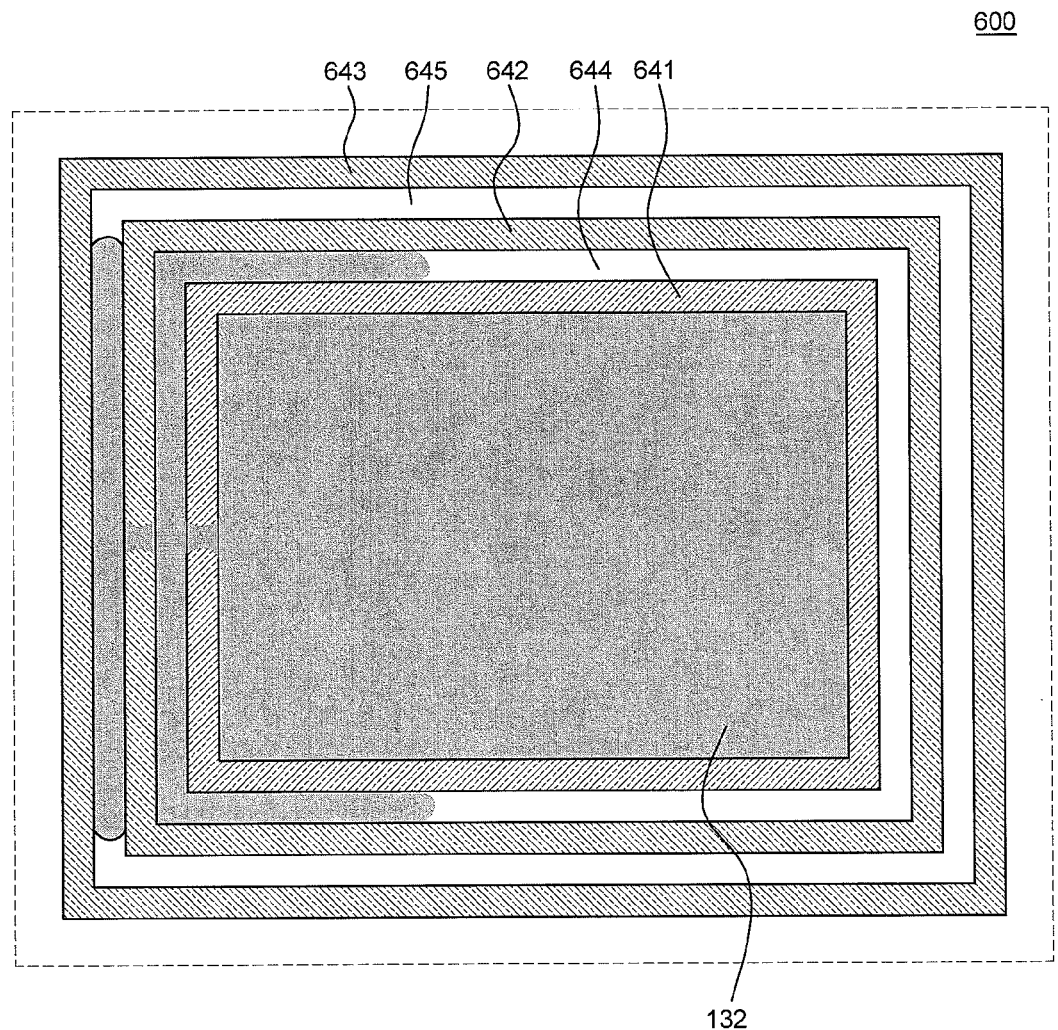
FIG. 6B is a schematic plan view for illustrating effects of a structure in an OLED device according to yet another example embodiment of the present disclosure.

FIG. 6A is a schematic enlarged view of an OLED device according to yet another example embodiment of the present disclosure. FIG. 6B is a schematic plan view for illustrating effects of a structure of an OLED device according to yet another example embodiment of the present disclosure.

Referring to FIG. 6A, a structure 640 includes a plurality of subsidiary walls 641, 642 and 643. The plurality of subsidiary walls 641, 642 and 643 may act as dams. The first subsidiary wall 641 is a single layer structure and is made of the same material as that of the bank 244 as illustrated in FIG. 2. The second subsidiary wall 642 is a double-layer structure and is made of the same materials as that of the bank 244 and the spacer 245 as illustrated in FIG. 2. The first subsidiary wall 641 and the second subsidiary wall 642 are spaced apart from each other. The third subsidiary wall 643 is a triple-layer structure and is made of the same materials as that of the bank 244, the spacer 245 and the planarizing layer 227 as illustrated in FIG. 2. The second subsidiary wall 642 and the third subsidiary wall 643 are spaced apart from each other. The wall 640 includes a first storage space 644 and a second storage space 645. The first subsidiary wall 641 is lower than the second subsidiary wall 642, and the second subsidiary wall 642 is lower than the third subsidiary wall 643. With this configuration, in case the particle cover layer 132 overflows, the particle cover layer 132 can be dispersed firstly via the first storage space 644 between the first subsidiary wall 641 and the second subsidiary wall 642. Then, in case the particle cover layer 132 overflows secondly, the particle cover layer 132 can be dispersed via the second storage space 645 between the second subsidiary wall 642 and the third subsidiary wall 643.

That is, as the subsidiary walls 641, 642 and 643 become higher from the inside to the outside of the OLED device 600 with storage spaces 644 and 645 formed between the subsidiary walls 641, 642 and 643, the overflowing particle cover layer 132 can be dispersed more effectively.

The plurality of subsidiary walls 641, 642 and 643 is especially effective when it is required to reduce the distance between the structure 640 and the pixel area 110 in order to make a narrow bezel.

With the exception of the portions explained above, the OLED device 600 according to another embodiment is identical to the OLED device 500 of a previous embodiment, and thus, redundant features will not be described for the sake of brevity.

The OLED device according to the example embodiment of the present disclosure may be modified in a variety of ways.

In some embodiments, the number of subsidiary walls and layers of the subsidiary walls may be designed in a variety of ways by selecting from among the bank 244, the spacer 245, the planarizing layer 227, the interlayer insulating film 226 and/or the common voltage line 116 of the plurality of pixels 111.

In some embodiments, for the pixel area 110 having four sides, a portion of a structure formed on the first side may have three subsidiary walls in parallel with the outer periphery of the pixel area 110 that are spaced apart from each other. The other portions of the structure formed on the second and third sides each may have two subsidiary walls that are in parallel with the outer periphery of the pixel area 110 and spaced apart from each other, and the remaining portion of the structure formed on the fourth side may have one subsidiary wall that is in parallel with the outer periphery of the pixel area 110. That is, different numbers of subsidiary walls may be formed along the outer periphery of the pixel area 110.

In some embodiments, the pixel area 110 may have walls spaced apart from four corners of the outer periphery, and shapes of the storage spaces at the corners defined inside the walls may be a rounded shape, a curved shape or diagonal shape, instead of storage spaces at a right angle shape. With such shapes, when the overflowing particle cover layer 132 is dispersed from one side to another via a storage space, the flow of the particle cover layer can be facilitated at the corners. As a result, overflow of the particle cover layer at the corners can be suppressed and dispersion of the particle cover layer at the corners can be improved.

In some embodiments, the pixel area 110 may have a circular or oval shape. The structure formed around the pixel area 110 may be formed in a circular or oval shape, conforming to the pixel area 110.

Figure 7A:
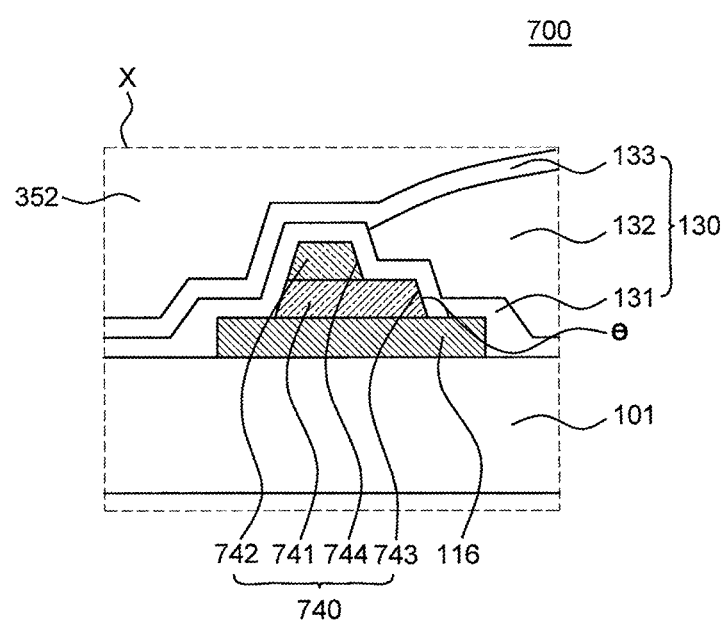
FIG. 7A is a schematic enlarged view of a stair-like dam of an OLED device according to yet another example embodiment of the present disclosure.
Figure 7B:
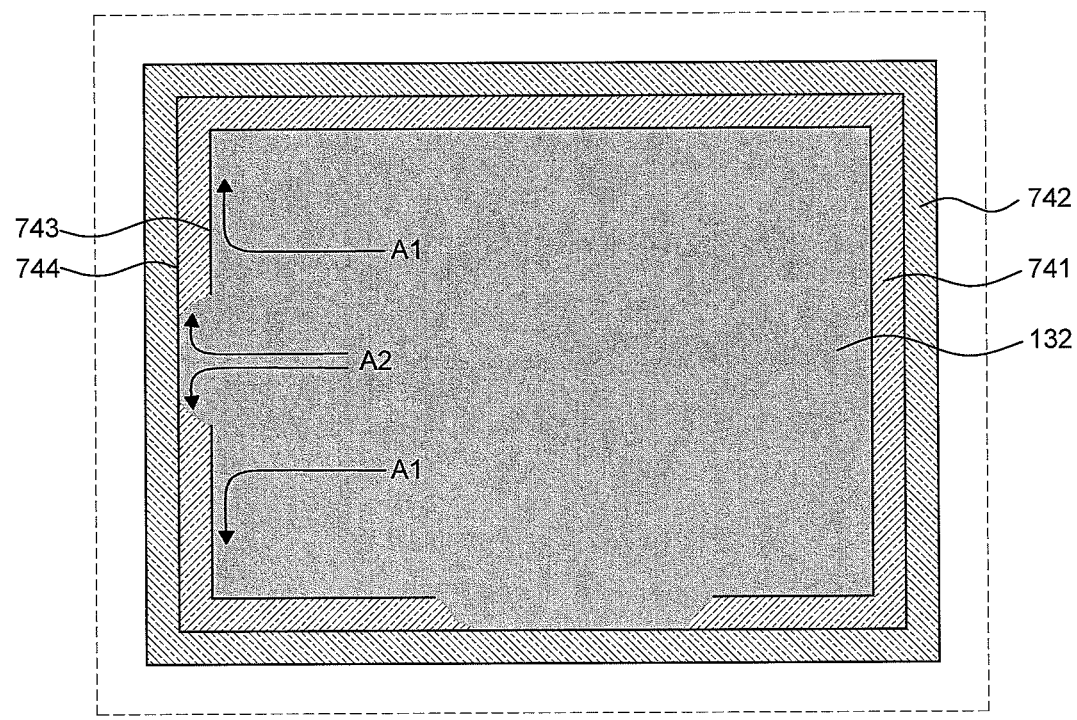
FIG. 7B is a schematic plan view for illustrating effects of the stair-like dam of an OLED device according to yet another example embodiment of the present disclosure.

FIG. 7A is a schematic enlarged view of a stair-like dam of an OLED device according to yet another example embodiment of the present disclosure. FIG. 7B is a schematic plan view for illustrating effects of the stair-like dam of an OLED device according to yet another example embodiment of the present disclosure. With the exception of the portions explained above, the OLED device 700, according to the other embodiment as illustrated in FIGS. 7A and 7B, is identical to the OLED device 100 of a previous embodiment as illustrated in FIG. 4, and thus, redundant features will not be described for the sake of brevity.

Referring to FIGS. 7A and 7B, the height of the stair-like dam 740 becomes higher toward the extended area where the first encapsulation layer 131 contacts the second encapsulation layer 133. Specifically, the stair-like dam 740 has a multilayer structure including a first stair 741 and a second stair 742. The first stair 741 and the second stair 742 are formed during the processes of forming the bank 244 and the spacer 245, respectively. That is, the stair-like dam 740 may be formed in a multilayer structure having a height between 2.5 μm and 4.5 μm by a design alteration of a mask without undergoing any additional process. In other words, the height of the stair-like dam 740 can be varied depending on design of the bank 244 and the spacer 245. As described above, in case the heights of the bank 244 and the spacer 245 are 1.3 μm and 2 μm, respectively, the height of the multi-layered, stair-like dam 740 is 3.3 μm. In particular, such a height of the stair-like dam 740 is optimized for the plurality of pixels 111. In addition, the stair-like dam 740 may be configured as three stairs by using the planarizing layer 227. In this case, the overall thickness may be further increased by 3.5 μm at most. That is, the maximum height of the stair-like dam 740 having three stairs may be up to 8 μm.

Referring to FIGS. 7A and 7B, the first inner wall 743 of the first stair 741 of the stair-like dam 740 may disperse the particle cover layer 132 into two ways with respect to the first inner wall 743. Specifically, as illustrated in FIG. 7B, by the first inner wall 743, the particle cover layer 132 is dispersed into two ways indicated by arrows A1 with respect to the first inner wall 743. Accordingly, the particle cover layer 132 is dispersed into the two ways with respect to the first inner wall 743 before the particle cover layer 132 flows over the first inner wall 743. Then, in case the particle cover layer 132 flows over the first inner wall 743, it reaches the second stair 742 and is dispersed into two ways indicated by arrows A2 with respect to the second inner wall 744.

According to this configuration of the stair-like dam 740, when the particle cover layer 132 overflows, it is effectively dispersed by the stairs sequentially.

The first encapsulation layer 131 is formed on the stair-like dam 740 conforming to the shape of it. The slope θ of the wall of the first encapsulation layer 131 formed on the stair-like dam 740 is equal to the slope in the cross section of the first stair 741 and the second stair 742. The slope of the bank 244 and the spacer 245 in the cross section may range from 30° to 90° with respect to the substrate 101. The slope of the bank 244 may be equal to or different from that of the spacer 245.

Figure 8A:
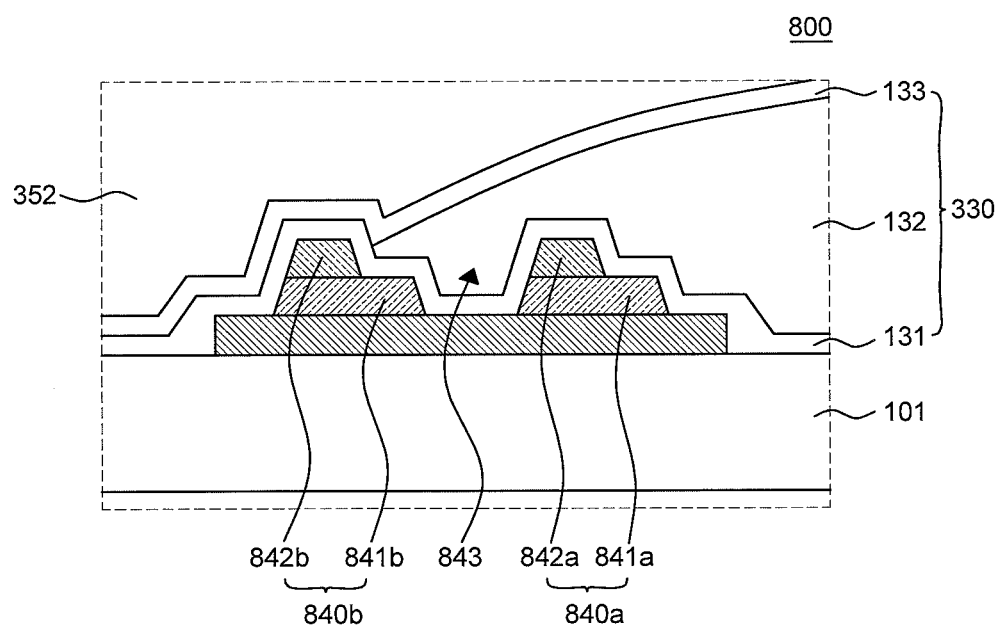
FIG. 8A is a schematic enlarged view of a stair-like dam of an OLED device according to yet another example embodiment of the present disclosure.
Figure 8B:
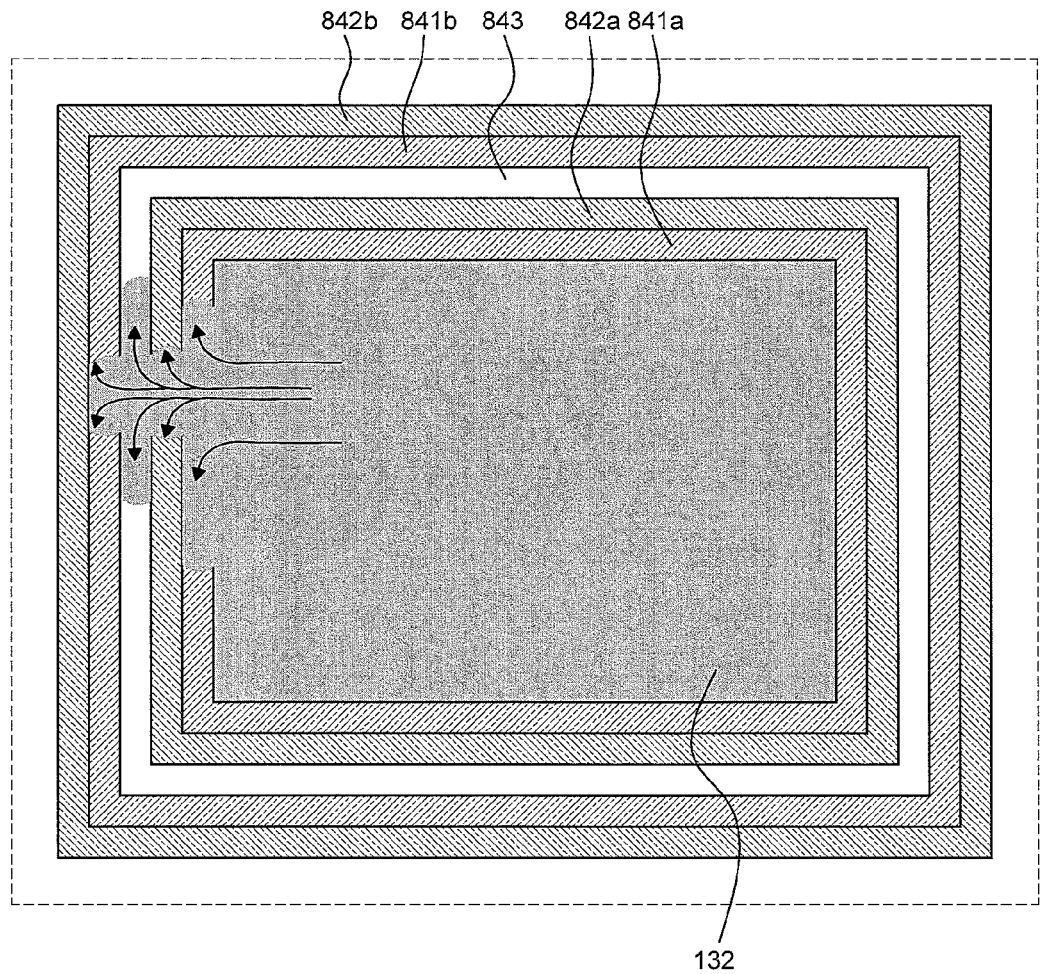
FIG. 8B is a schematic plan view for illustrating effects of the stair-like dam of an OLED device according to yet another example embodiment of the present disclosure.

FIG. 8A is a schematic enlarged view of stair-like dams in an OLED device according to yet another example embodiment of the present disclosure. FIG. 8B is a schematic plan view for illustrating effects of the stair-like dams in an OLED device according to yet another example embodiment of the present disclosure. The OLED device 800 as illustrated in FIGS. 8A and 8B includes stair-like dams different from the stair-like dam 740 as illustrated in FIGS. 7A and 7B.

Referring to FIG. 8A, the OLED device 800 includes a first subsidiary stair-like dam 840a and a second subsidiary stair-like dam 840b. Each of the stair-like dams includes a first stair 841a and 841b and a second stair 842a and 842b, respectively. The second stairs 842a and 842b are formed on the first stair 841a and 841b, respectively. The second stairs 842a and 842b are disposed more to the outside of the pixel area 110 at least by 5 μm than the first stairs 841a and 841b, respectively, in order to form the first stairs 841a and 841b. A storage space 843 is defined between the first subsidiary stair-like dam 840a and the second subsidiary stair-like dam 840b. The storage space 843 may act as a channel configured to disperse the particle cover layer 132 when the particle cover layer 132 overflows.

The width in the cross section of the first stairs 841a and 841b is preferably between 30 μm and 100 μm, more preferably between 40 μm and 50 μm. The widths in the cross section of the second stairs 842a and 842b are preferably between 5 μm and 20 μm, more preferably between 10 μm and 12 μm. The width of the storage space 843 is determined by the distance between the first subsidiary stair-like dam 840a and the second subsidiary stair-like dam 840b. The distance is between 10 μm and 30 μm, more preferably 20 μm.

The width in cross section of the first stair 841a of the first subsidiary stair-like dam 840a may differ from that of the first stair 841b of the second subsidiary stair-like dam 840b.

For example, the first stair 841a of the first subsidiary stair-like dam 840a that is closer to the pixel area 110 may have a wider cross section than the first stair 841b of the second subsidiary stair-like dam 840b because the first stair 841a has to bear the weight of the particle cover layer 132 more.

The width in cross section of the second stair 842a of the first subsidiary stair-like dam 840a may differ from that of the second stair 842b of the second subsidiary stair-like dam 840b. For example, the second stair 842a of the first subsidiary stair-like dam 840a that is closer to the pixel area 110 may have a wider cross section than the second stair 842b of the second subsidiary stair-like dam 840b because the second stair 842a has to bear the weight of the particle cover layer 132 more.

By varying factors related to the storage space 843, the particle cover layer 132 can be more effectively dispersed.

For example, in case the distance between the subsidiary stair-like dams is reduced, the storage space 843 formed therebetween may promote capillary action, so that the particle cover layer 132 can be dispersed more quickly via the storage space 843.

For example, the viscosity of the particle cover layer 132 may be lowered. As the viscosity of the particle cover layer 132 becomes low, the particle cover layer 132 can be dispersed more quickly via the storage space 843.

For example, by adding a wetting agent to the particle cover layer 132 in order to change its surface tension and in turn its wettability, the particle cover layer 132 can be dispersed more quickly via the storage space 843.

The plurality of subsidiary stair-like dams 840a and 840b is especially effective when it is required to reduce the distance between the subsidiary stair-like dams 840a and 840b and the pixel area 110 in order to make a narrow bezel.

Referring to FIG. 5B, if the particle cover layer 132 flows over the first stair 841a and the second stair 842a of the first subsidiary stair-like dam 840a sequentially, the particle cover layer 132 flows into the storage space 843 to be dispersed into two ways along the storage space 843. Accordingly, the particle cover layer 132 is stored in the storage space 843, and it is possible to effectively suppress the particle cover layer 132 from flowing over the second subsidiary stair-like dam 840b.

Preferably, the storage space 843 surrounds all four sides of the pixel area of the OLED device 800. With this configuration, even if the particle cover layer 132 flows over one of the four sides, the particle cover layer 132 can be effectively dispersed by the storage space 843 formed along the four sides.

With the exception of the portions explained above, the OLED device 800 according to the other embodiment is identical to the OLED device 700 of a previous embodiment, and thus, redundant features will not be described for the sake of brevity.

Figure 9:
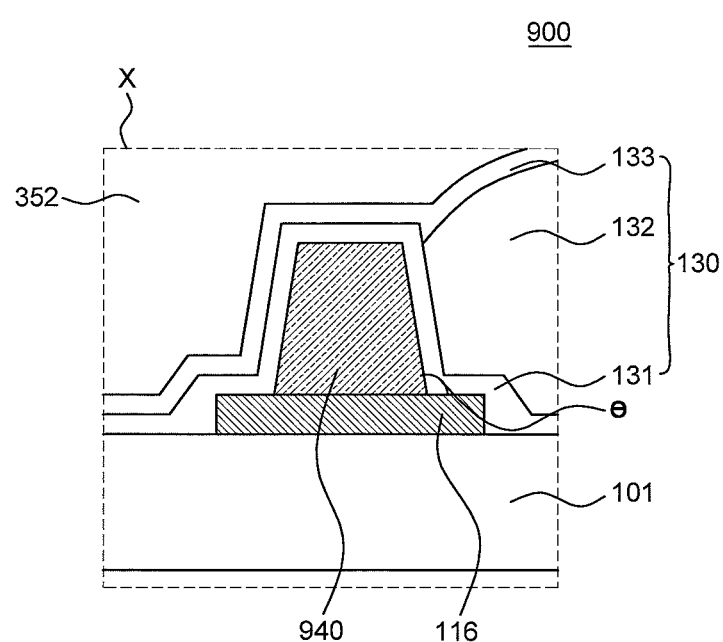
FIG. 9 is a schematic enlarged view of a metal structure in an OLED device according to yet another example embodiment of the present disclosure.

FIG. 9 is a schematic enlarged view of a metal structure in an OLED device according to yet another example embodiment of the present disclosure. The OLED device 900 illustrated in FIG. 9 is identical to the OLED device 100 illustrated in FIG. 4 except that the structure 140 in the OLED device 100 is replaced by a metal structure, and thus, redundant features will not be described for the sake of brevity).

The metal structure 940 is formed in the non-pixel area of the OLED device 900. The metal structure 940 is spaced apart from the pixel area 110 and is spaced apart from the outermost periphery of the substrate 101. As illustrated in FIG. 9, the flow of the particle cover layer 132 is blocked by the metal structure 940. Referring to FIG. 9, the metal structure 940 may be formed via a screen printing process. Specifically, a metal paste is applied onto a mask of a metal mesh, and then a squeegee is moved. As a result, the metal structure 940 is applied around the particle cover layer 132. In the metal paste, an initiator may be included that enables curing by heat or ultraviolet waves.

In particular, such a screen printing process has advantages in that it can be carried out at a lower temperature than sputtering, which is typically used for metal deposition, and that it does not involve a chemical process which may possibly damage the OLED device 240. In addition, when the metal structure is formed via such as a screen printing process, it is possible to make the height of the metal structure similar to the height of the particle cover layer 132. Specifically, the height of the metal structure 940 may be between 5 μm and 20 μm.

Further, the metal structure 940 may be produced via a dispensing nozzle process that is capable of applying a metal paste.

In addition, the metal structure 940 may be produced via an ink-jet coating process that is capable of applying an ink containing a metal.

Further, the metal structure 940 may be produced via a rolling-printing process that is capable of applying a metal paste.

The metal structure 940 may be made of silver (Ag), tin (Sn), aluminum (Al), an indium tin oxide (ITO), etc.

The metal structure 940 may be formed on the common voltage line 116. Accordingly, the height of the metal structure 940 is increased as the thickness of the common voltage line 116 increases. Accordingly, the common voltage line 116 can be electrically connected to the metal structure 940, and the same effect is obtained as if the thickness of the common voltage line 116 were increased. As a result, the capacity of the common voltage line 116 can be increased.

The first encapsulation layer 131 is formed on the metal structure 940 conforming to the shape of the metal structure 940. The second encapsulation layer 133 is formed on the particle cover layer 132 and the first encapsulation layer 131. The first encapsulation layer 131 comes in contact with the second encapsulation layer 133 at the outer side of the structure 940. With this configuration, the particle cover layer 132 is sealed by the first encapsulation layer 131 and the second encapsulation layer 133, so that the direct path of moisture permeation via the particle cover layer 132 is suppressed.

Figure 10A:
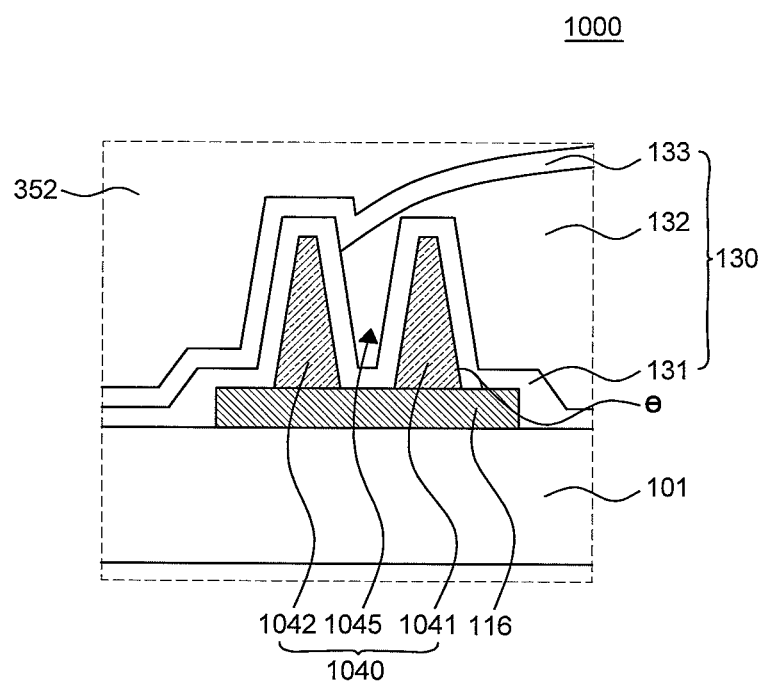
FIG. 10A is a schematic enlarged view of a metal structure in an OLED device according to yet another example embodiment of the present disclosure.
Figure 10B:
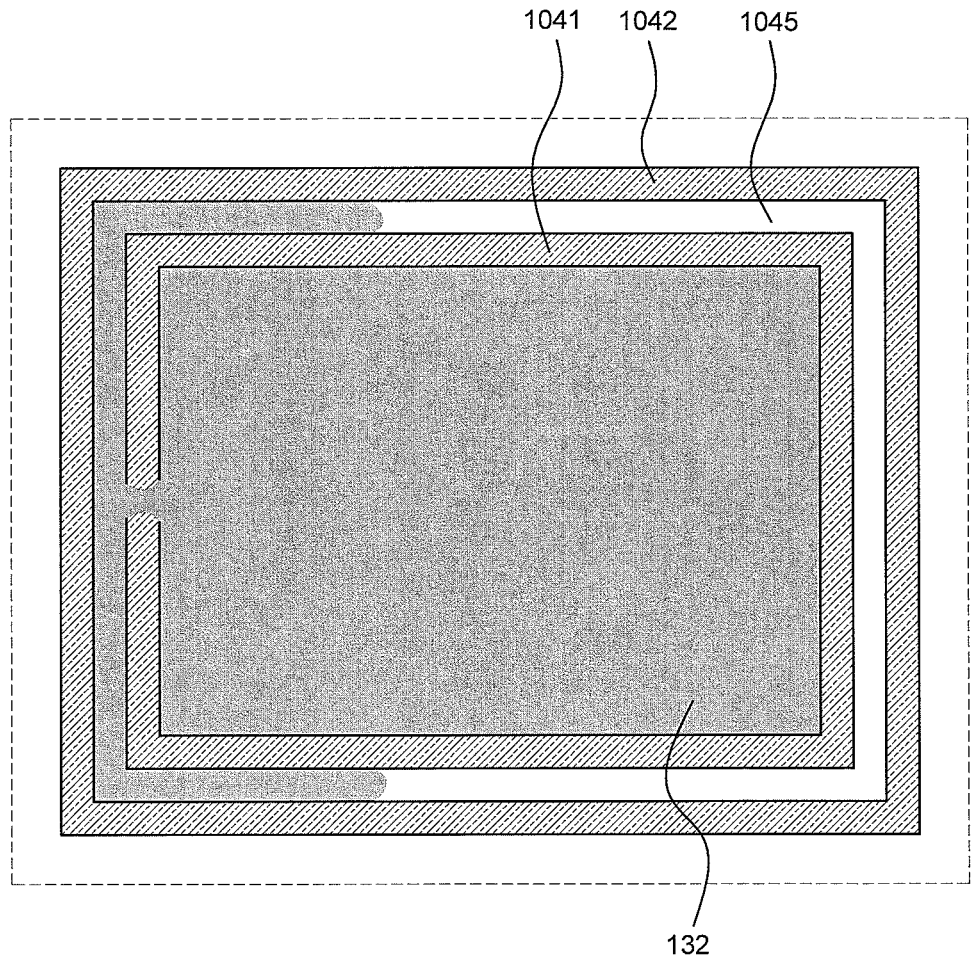
FIG. 10B is a schematic plan view for illustrating effects of the metal structure in an OLED device according to yet another example embodiment of the present disclosure.

FIG. 10A is a schematic enlarged view of a metal structure in an OLED device according to yet another example embodiment of the present disclosure. FIG. 10B is a schematic plan view for illustrating effects of the metal structure in an OLED device according to another example embodiment of the present disclosure. The OLED device 1000 illustrated in FIGS. 10A and 10B includes a different metal structure 1040 from the OLED device 900 illustrated in FIG. 9.

Referring to FIG. 10A, the structure 1040 in the OLED device 1000 includes a first subsidiary metal structure 1041 and a second subsidiary metal structure 1042. The first subsidiary metal structure 1041 and the second subsidiary metal structure 1042 are spaced apart from each other, and a storage space 1045 is defined therebetween. The storage space 1045 may act as a channel.

The width in the cross section of the first subsidiary metal structure 1041 and the second subsidiary metal structure 1042 is preferably between 10 μm and 100 μm, more preferably 20 μm. The width in the cross section of the storage space 1045 is preferably between 10 μm and 30 μm, more preferably 20 μm.

The width in the cross section of the first subsidiary metal structure 1041 may differ from that of the second subsidiary metal structure 1042. For example, the inner first subsidiary metal structure 1041 that is closer to the outer periphery of the pixel area 110 may have a wider cross section than the outer second subsidiary metal structure 1042 because the first subsidiary metal structure 1041 has to bear the weight of the particle cover layer 132, like a dam for storing water.

By varying factors related to the storage space 1045, the particle cover layer 132 can be more effectively dispersed. For example, by forming the first and second subsidiary metal structures 1041 and 1042 defining the storage space 1045 closely to each other, capillary action can be more easily induced, so that the particle cover layer 132 can be dispersed more quickly via the storage space 1045. In addition, the viscosity of the particle cover layer 132 may be lowered, or a wetting agent may be added to the particle cover layer 132.

Referring to FIG. 10B, in case the particle cover layer 132 flows over the inner first subsidiary metal structure 1041, the particle cover layer 132 is dispersed into two ways along the storage space 1045. Accordingly, the particle cover layer 132 is contained in the storage space 1045 inside the subsidiary metal structures 1041 and 1042, and thus, it is possible to effectively suppress the particle cover layer 132 from flowing over the outer second subsidiary metal structure 1042 of the metal structure 1040.

Preferably, the storage space 1045 surrounds all four sides of the pixel area of the OLED device 1000. With this configuration, even if the particle cover layer 132 flows over one of the four sides, the particle cover layer 132 can be effectively dispersed by the storage space 1045 formed along the four sides.

Thus far, example embodiments of the present disclosure have been described in detail with reference to the accompanying drawings. However, the present disclosure is not limited to the example embodiments, and modifications and variations can be made thereto without departing from the technical idea of the present disclosure. Accordingly, the example embodiments described herein are merely illustrative and are not intended to limit the scope of the present disclosure. The technical idea of the present disclosure is not limited by the example embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:
1. An organic light-emitting display (OLED) device comprising:
 a pixel area defined by a plurality of pixels on a flexible substrate;
 a non-pixel area around the pixel area;
 a gate driver in the non-pixel area;
 a structure in the non-pixel area configured to surround the pixel area;
 a first encapsulation layer covering the plurality of pixels, the gate driver and the structure; and
 cover layer covering the pixel area,
 wherein the structure comprises a plurality of walls, wherein a wall disposed closer to the inside among the plurality of walls is configured to be lower than a wall disposed closer to the outside among the plurality of walls, wherein the wall disposed closer to the inside is at least one layer and is made of the same material as a material of at least one of a bank, a spacer, a planarizing layer and an interlayer insulating film disposed in the plurality of pixels, and wherein the wall disposed closer to the outside is a multilayer and is made of the same materials as materials of at least two of the bank, the spacer, the planarizing layer and the interlayer insulating film disposed in the plurality of pixels.

2. The OLED device of claim 1, further comprising a second encapsulation layer covering the first encapsulation layer and the cover layer.

3. The OLED device of claim 2, wherein the structure includes at least one of an organic material and an inorganic material, and the first encapsulation layer covering the structure resists penetration of moisture through the structure.

4. The OLED device of claim 1, further comprising:
a second encapsulation layer;
a flexible encapsulation unit disposed to cover the pixel area and the non-pixel area, the flexible encapsulation unit having the first encapsulation layer, the second encapsulation layer, the structure and the cover layer; and
a barrier film comprising a pressure-sensitive adhesive layer and attached on the flexible encapsulation unit by the pressure-sensitive adhesive layer, wherein the barrier film is attached on the second encapsulation layer of the flexible encapsulation unit, and wherein the structure has a particular height and is configured to surround the cover layer in the non-pixel area, so that a portion of the pressure-sensitive adhesive layer is configured to be pressed by the structure to be attached in the non-pixel area.

5. The OLED device of claim 4, wherein the structure is a multilayer structure and
wherein the multilayer structure has a particular height that is capable of suppressing the excessively spread for increasing adhesion of the barrier film.

6. The OLED device of claim 5, wherein a width in cross section of a top layer of the multilayer structure is narrower than a width in cross section of a bottom layer thereof.

7. The OLED device of claim 1, further comprising a storage space configured to receive the cover layer when the cover layer overflows, the storage space being disposed between the plurality of walls.

8. The OLED device of claim 1, further comprising a metal layer disposed under the structure.

9. The OLED device of claim 7, wherein the storage space is configured to surround the pixel area.

10. The OLED device of claim 7, wherein the storage space contains an overflowed portion of the cover layer.

11. An organic light-emitting display (OLED) device comprising:
a pixel area defined by a plurality of pixels on a flexible substrate;
a non-pixel area around the pixel area;
a gate driver in the non-pixel area;
a structure in the non-pixel area configured to surround the pixel area;
a first encapsulation layer covering the plurality of pixels, the gate driver and the structure; and
a cover layer covering the pixel area, wherein the structure is a multilayer structure to suppress excessive spread of the cover layer, wherein a top layer of the multilayer structure comprises a plurality of subsidiary structures, and wherein the subsidiary structures are spaced apart from each other and comprise a storage space configured to disperse the cover layer when the cover layer overflows.

12. The OLED device of claim 11, wherein the multilayer structure is made of the same material as materials of at least two of a bank, a spacer, a planarizing layer and an interlayer film disposed in the plurality of pixels.

13. The OLED device of claim 11, wherein the storage space is configured to surround the pixel area.

14. The OLED device of claim 11, wherein the cover layer is configured to planarize the pixel area, and
wherein a height of the cover layer near the structure is higher than a height of the structure.

15. An organic light-emitting display (OLED) device comprising:
a pixel area defined by a plurality of pixels on a flexible substrate;
a non-pixel area around the pixel area;
a gate driver in the non-pixel area;
a structure in the non-pixel area configured to surround the pixel area; and
a flexible encapsulation unit configured to seal the plurality of pixels and comprising:
a first encapsulation layer covering the plurality of pixels, the gate driver and the structure,
a cover layer covering the pixel area, the cover layer acting as a compensation layer that planarizes the plurality of pixels, and a height of the cover layer gradually decreases from an outer periphery of the plurality of pixels to the structure, and
a second encapsulation layer covering the cover layer, wherein the cover layer is sealed by the first encapsulation layer and the second encapsulation layer at the outer periphery of the plurality of pixels, and an area where the first encapsulation layer and the second encapsulation layer come in contact with each other is extended beyond the structure by a particular distance.

16. The OLED device of claim 15, wherein the structure includes a stair-like dam that is configured to become higher towards the extended area.

17. The OLED device of claim 16, wherein the stair-like dam comprises a plurality of subsidiary stair-like dams spaced apart from each other, and comprises an interposed storage space configured to disperse the cover layer when the cover layer overflows.

18. The OLED device of claim 15, wherein the structure includes a metal structure made of a metal material.

19. The OLED device of claim 18, wherein the metal structure further comprises a plurality of subsidiary metal structures spaced apart from each other.

20. The OLED device of claim 19, wherein the metal structure is made of one of silver (Ag), tin (Sn), aluminum (Al) and an indium tin oxide (ITO).

21. The OLED device of claim 15, further comprising a storage space configured to receive the cover layer when the cover layer overflows, the storage space being disposed between a plurality of walls of the structure.

22. The OLED device of claim 21, further comprising a metal layer disposed under the structure.

* * * * *